(12) United States Patent
Kaempfe et al.

(10) Patent No.: US 9,389,351 B2
(45) Date of Patent: Jul. 12, 2016

(54) PLANAR POLARIZATION TRANSFORMER

(75) Inventors: Thomas Kaempfe, Villeurbanne (FR); Olivier Parriaux, Lausanne (CH)

(73) Assignee: Université Jean-Monnet, Saint-Etienne (FR)

(*) Notice: Subject to any disclaimer, the term of this patent is extended or adjusted under 35 U.S.C. 154(b) by 113 days.

(21) Appl. No.: 14/118,796

(22) PCT Filed: May 31, 2012

(86) PCT No.: PCT/EP2012/060294
§ 371 (c)(1),
(2), (4) Date: Jan. 27, 2014

(87) PCT Pub. No.: WO2012/164037
PCT Pub. Date: Dec. 6, 2012

(65) Prior Publication Data
US 2014/0146390 A1 May 29, 2014

(30) Foreign Application Priority Data

Jun. 1, 2011 (EP) .................................... 11290252

(51) Int. Cl.
*G02B 5/30* (2006.01)
*G02B 5/18* (2006.01)
(Continued)

(52) U.S. Cl.
CPC ............... *G02B 5/30* (2013.01); *G02B 5/1809* (2013.01); *G02B 5/1871* (2013.01); *G02B 5/3083* (2013.01); *G02B 27/286* (2013.01); *G06F 17/50* (2013.01)

(58) Field of Classification Search
CPC .. G02B 27/286; G02B 5/1809; G02B 5/1871; G02B 5/30; G02B 5/3083; G02B 5/1819; G02B 5/1828; G02B 5/1866–5/3025; G02B 5/32; G02B 5/1847; G02B 5/18; G02B 5/3041; G02B 2005/1804; G02B 27/4261; G02B 27/0944; G02B 27/44; G02B 27/4211; G02B 27/4277; G02B 27/0037; G02B 5/1814; G02B 5/1833; G02B 5/1876; G02B 5/1852; G02B 5/1861; G02B 5/3058; G02B 5/305; G02B 5/3033; G02B 6/0056; G06F 17/50; G01D 5/38; G01V 3/12; G11B 7/1353; B82Y 10/00; G02F 1/133528; G02F 1/13362; G02F 2001/133548; G02F 2202/40; B29D 11/00634; F21V 9/14; H04N 9/316
USPC .................. 359/437, 483.01, 485.01, 485.02, 359/486.01, 489.01, 585, 566, 489.06, 569, 359/486.1, 586, 576, 558, 574, 575, 485.05, 359/487.03; 252/585; 372/102, 106, 27; 342/22; 362/19; 353/20
See application file for complete search history.

(56) References Cited

U.S. PATENT DOCUMENTS 7,167,615 B1* 1/2007 Wawro et al. .................. 385/37
2007/0070276 A1 3/2007 Tan et al.
2008/0130110 A1 6/2008 Nakai

OTHER PUBLICATIONS

A.V. Tischenko, "Phenomenological representation of deep and high contrast lamellar gratings by means of the modal method," Optical and Quantum Electronics (2005) pp. 309-330.
(Continued)

*Primary Examiner* — Thomas K Pham
*Assistant Examiner* — Ibrahima Diedhiou
(74) *Attorney, Agent, or Firm* — Oblon, McClelland, Maier & Neustadt, L.L.P.

(57) ABSTRACT

The planar polarization transformer for a normally incident optical wave or beam having a given vacuum wavelength $\lambda$ comprises an optical planar grating between a cover medium of refractive index $n_c$ and an optical substrate of refractive index $n_s$, this planar grating defining a binary index modulation or corrugation of substantially rectangular profile with periodic ridges. This polarization transformer is characterized in that the ridge refractive index $n_r$ is larger than the substrate refractive index $n_s$, the grating period $\Lambda$ is larger than $0.4 \cdot \lambda/n_c$, the substrate refractive index $n_s$ is smaller than $2.7 \cdot n_c$, and the index modulation or corrugation is designed such that, according to the grating mode dispersion equation, the effective index of the mode $TE_0$ is larger than the substrate index $n_s$ and the effective index of the mode $TM_0$ is larger than the cover refractive index and smaller than the substrate index.

20 Claims, 8 Drawing Sheets

(51) Int. Cl.
*G02B 27/28* (2006.01)
*G06F 17/50* (2006.01)

(56) References Cited

OTHER PUBLICATIONS

International Search Report issued in corresponding application PCT/EP2012/060294, completed Jul. 24, 2012 and mailed Jul. 31, 2012.

Ze'Ev Bomzon et al., "Radially and azimuthally polarized beams generated by space-variant dielectric subwavelength gratings," Optics Letters, Mar. 1, 2002, vol. 27, No. 5, pp. 285-287.
Gilad M. Lerman et al., "Generation of a radially polarized light beam using space-variant subwavelength gratings at 1064 nm," Optics Letters, Dec. 1, 2008, vol. 33, No. 23, pp. 2782-2784.
Mc Grating, Modal and C Methods Grating Design and Analysis Software, downloaded from www.mcgrating.com on Nov. 14, 2013.
Dimitri Mawet et al., "Subwavelength surface-relief gratings for stellar coronagraphy," Appl. Opt. 44, pp. 7313-7321 (2005).

* cited by examiner

PLANAR POLARIZATION TRANSFORMER

FIELD OF THE INVENTION

The invention concerns the transformation of the polarization distribution at the cross-section of a light beam into another polarization distribution by means of a planar zeroth order ($0^{th}$ order) diffractive element, i.e. an optical element that diffracts the light only in the $0^{th}$ order (all higher order diffraction orders are below their cutoff and are evanescent in the incidence and transmission media).

The polarization state of laser beams is in most laser applications linear or circular. There is a growing interest in laser-matter interactions, in optical trapping of particles, in charged particle acceleration, in the generation of cylindrical waves, of axicons, etc. to have beams with a different distribution of the polarization over their cross-section, for instance the radial or the azimuthal polarization. Such polarized beams can be generated from the laser cavity directly by using a grating mirror that dictates the emission of the desired polarization distribution. This is however not always possible or desired. For instance, the beam emitted by edge emitting semiconductor lasers has a linear polarization, so have the femtosecond lasers beams resulting from an intra-cavity CPA amplification scheme. There is therefore a need for a compact, monolithic optical element capable of transforming the polarization distribution over the cross-section of an input beam into a desired polarization distribution.

BACKGROUND OF THE INVENTION

The modern solution for the above mentioned planar zeroth order diffractive element is an element that can locally rotate the local input linear polarization by the desired angle and does so by means of a spatially resolved half-wave birefringent element whose birefringence axis is oriented along the bisector of the angle between the input and output linear polarizations. This solution generally rests on the birefringence property of a $0^{th}$ order subwavelength binary corrugation grating structure defined at the surface of a high refractive index material.

More particularly, the structure of the state of the art consists of a binary, periodic grating of period $\Lambda$ with essentially vertical walls wherein the grooves substantially have the refractive index of the cover material $n_c$ (usually air) and the ridges are made of a high index material having the refractive index $n_s$ of the substrate in which the grating is microstructured as a pure surface relief (or corrugation) grating. The period of the grating has to be small enough to avoid the generation of diffraction orders higher than the $0^{th}$ order in the cover and in the substrate. This imposes the condition (given that $n_s$ is larger than $n_c$):

$$\Lambda < \frac{\lambda}{n_s} \tag{1}$$

when the beam incidence is normal to the grating plane and where $\lambda$ is the wavelength of the light in vacuum. The condition of equality between $\Lambda$ and $\lambda/n_s$ is named the cutoff condition for the $+/-1^{st}$ orders under normal incidence, and condition (1) under which all diffraction orders except the $0^{th}$ order do not propagate in the substrate (they are "evanescent") corresponds to these orders being "below cutoff", which is equivalent to the grating being called "subwavelength".

The polarization component of the incident beam having its electric field parallel to the local grating lines is called the TE polarization and the orthogonal polarization component having the electric field normal to the grating lines is the TM polarization, as shown in FIG. 1. The aim for a polarization transformer is to achieve a phase shift of $\pi$ between the TE and TM polarizations and to have as low as possible losses due to reflection. The grating then acts as a spatially distributed half-wave element, locally mirroring the input electric field with regard to the local orientation of the grating lines. This mirroring can be seen as a rotation of the polarization, where the rotation angle $\alpha$ for a y-axis oriented polarization, after passing through a grating oriented at angle $\beta$ with regard to the y-axis, is given by:

$$\alpha = 2\beta \tag{2}$$

In order to transform a linear polarization into a spatially non uniform polarization, the E-Field has to be turned by a specific angle $\beta$ at each point within the beam cross section. As represented in FIG. 2, for the example of transforming a linear to a radial polarization, the required direction of the E-Field after the polarizer is equal to the polar angle $\Theta$ of the corresponding position in the beam in a polar coordinate system with its centre at the beam centre. The corresponding grating pattern is sketched in FIG. 2. Note that by turning the element by 90°, one can produce azimuthally polarized light from the same incident beam as also represented in this FIG. 2.

The grating has to fulfill the condition $\beta = \Theta/2$ everywhere over the beam cross-section. This is not possible to achieve with continuous grating lines without accepting a change in the period (as shown in FIG. 2). If this period change is too large regarding the period tolerance of the grating with respect to its phaseshifting property, a suitable segmentation of the element must be made as represented in FIG. 3. The grating design of FIG. 3 geometrically corresponds to the one of FIG. 2 so that this segmented grating transforms a linear polarization into a radial polarization or into an azimuthal polarization as shown in FIG. 2. The lateral arrangement of such grating lines and the phase functions created by such an element, are known in the scientific literature (e.g. Bomzon, Z.; Biener, G.; Kleiner, V. & Hasman, E., "Radially and azimuthally polarized beams generated by space-variant dielectric subwavelength gratings," Opt. Lett. 27, 285-287 (2002)).

In the solution of the state of the art for the grating in a polarization rotating element (described by Lerman G., Levy U., Optics Letters 33, 2782-2784 (2008)), the grating is a pure surface relief grating, i.e. the ridge material is the same as the grating material. It can be shown that in this described solution the $0^{th}$ order grating mode only has a propagating character, while higher order grating modes are evanescent (chapter 5 in Tishchenko, A., "Phenomenological representation of deep and high contrast lamellar gratings by means of the modal method," Opt. Quantum. Electron., Springer 37, 309-330 (2005)). In such pure relief grating the fundamental $TE_0$ and $TM_0$ modes always have an effective index which is located between the low index $n_c$ of the cover and the high index $n_s$ of the substrate which implies that either the TE or the TM polarization exhibits notably less than 100% transmission. This will be clearly established later on in the description of the invention.

The requirement of zero diffraction loss in the substrate of high refractive index imposes a corrugation period $\Lambda$ smaller than $\lambda/n_s$ (see Equation (1)) which is necessarily very small since the condition for a high TE/TM birefringence calls for a large index $n_s$ so as to require grooves that are not too deep and too difficult to fabricate. This can be understood from the effective medium theory used in the state of the art: it is known that with so small a period (much smaller than the wavelength in vacuum) the hypothesis of effective medium for the corrugated layer holds; accordingly, the grating modes of order higher than $0^{th}$, which are evanescent, are not taken into consideration and the grating layer is treated as a homogeneous layer characterized by an "effective index". This homogenized grating layer between the cover medium and the substrate medium thus defines a Fabry-Perot filter for each linear polarization component of the incident light beam. In the effective medium theory, the effective index of the homogenized grating layer "seen" by the linear polarization components of the light beam is given by:

$$n_{\it eff}^{TE} = \sqrt{Dn_s^2 + (1-D)n_c^2},\qquad(3)$$

$$n_{\it eff}^{TM} = 1 \bigg/ \sqrt{\left(\frac{D}{n_s^2} + \frac{(1-D)}{n_c^2}\right)}$$

where D is the duty cycle of the grating, calculated as $D=W_r/\Lambda$ with $W_r$ being the width of the ridges of the grating as shown in FIG. 4A. It is worth noting here that these expressions coincide with the effective index of the $0^{th}$ order $TE_0$ and $TM_0$ grating modes as calculated by the exact modal theory for an infinitely small period. In FIG. 4B, the curves of the effective indexes of the $0^{th}$ order grating modes $n_{\it eff}^{TE}$ and $n_{\it eff}^{TM}$ are given in function of D for three cases: $n_s=1.5$, $n_s=2.5$ and $n_s=3.5$. It can be seen that the birefringence effect strongly decreases with a decrease of the substrate refractive index $n_s$; this in turn implies an increase of the grating height needed to accumulate a phase shift of $\pi$ between the $TE_0$ and $TM_0$ grating modes upon their propagation through the grating corrugation. This is why a high refractive index is selected for the substrate in which the grating is microstructured.

One of the consequences of the period having to be much smaller than the wavelength as required in the solution of the state of the art (ref. to Equation (1)) is that the field transmission and reflection coefficients of the modes at the top and bottom interfaces are essentially real, i.e., their phase is either close to 0 or close to $\pi$ as implicitly assumed in the effective medium theory. This has the adverse consequence that achieving in a shallow (i.e., fabricable) grating corrugation the three needed conditions of TE and TM Fabry-Perot filters being set at the maximum resonant transmission peak with minimal grating height (i.e. minimal amount of $2\pi$ multiples of the phase for one roundtrip of the light in the Fabry Perot) and the transmitted TE and TM fields being $\pi$ out of phase is in principle impossible for the refractive indexes available in nature at optical frequencies (see the explanation of this in the description of the invention). The solution of the state of the art is therefore a compromise which has to be searched for numerically, for instance with an air cover and a GaAs substrate ($n_s=3.48$) a TE and TM transmission of 86% and 96% respectively at $\lambda=1064$ nm with a period as small as 240 nm, i.e., smaller than a quarter of the wavelength, a ridge width of 144 nm and a groove depth of 470 nm (Lerman G., Levy U., Optics Letters 33, 2782-2784 (2008)), i.e., an aspect ratio of 3.2 for the ridges and 4.9 for the grooves, which is extremely difficult to fabricate.

It is to be noted that the reduced overall transmission, caused by the in-principle impossibility to fulfill the conditions for the $\pi$-phaseshifted 100% transmissions of the TE and TM Fabry-Perots, can be partly circumvented by depositing an antireflection layer at the top of the grating lines and at the bottom of the grooves as disclosed in Dimitri Mawet, Pierre Riaud, Jean Surdej, and Jacques Baudrand, "Subwavelength surface-relief gratings for stellar coronagraphy," Appl. Opt. 44, pp. 7313-7321 (2005). This however adds to the fabrication difficulty, and it does not change the requirement of the critical depth and width of the corrugation.

Thus, the grating elements of the prior art used as polarization transformers face at least two problems. First, they are difficult to manufacture because of the small grating period and of the grating profile with a large groove aspect ratio (groove height divided by groove width). Secondly, their power transmission is notably smaller than 100%. This will be better understood in the following description of the invention.

In order to suppress the reflection from a pure relief grating of the prior art represented by the Optics Letter article by G. Lerman et al., document US 2008/130110 A1 discloses an additional 2D subwavelength grating on top of the 1D birefringent polarizing grating, made of a different material as the etched substrate whose function is to act as an $O^{th}$ order antireflection micro-structured layer at the air side of the form-birefringent grating where the reflection is the larger. This measure does not change the requirement on the critical depth and width of the grooves and requires a second set of layer deposition, lithography and etching processes with critical alignment between 1D and 2D corrugations.

SUMMARY OF THE INVENTION

For a subwavelength grating (i.e. in a grating fulfilling the cutoff condition $\Lambda<\lambda/n_s$), the $0^{th}$ diffraction order only has a propagating character in the substrate and the cover media, whereas all higher orders are evanescent. This condition closely (but not exactly) corresponds to the fundamental grating modes $TE_0$ and $TM_0$ having an up and down propagating character whereas the grating modes of higher order have an evanescent character along the walls and grooves of the corrugation. Further, in the case of a relatively small period as in the prior art, i.e. $\Lambda$ well below the wavelength, e.g. $\Lambda<\lambda/4$, those higher order grating modes can then be neglected in the analysis, and do not contribute notably in the grating transmission, given that for usual grating heights needed for a $\pi$ phase shift between TE and TM polarizations their amplitude has decreased sufficiently at the output interface of the grating corrugation because of their strong exponential decay. Thus, the process of light interaction with such a grating of relatively small period can be considered as analogous to light interaction with a homogeneous layer forming a Fabry-Perot cavity. Therefore, the known Fabry-Perot resonance properties can be used to understand and design the transmission and reflection spectra of subwavelength gratings for both polarizations separately. The analogy with a homogeneous medium also approximately holds for the field reflection and transmission coefficients r and t respectively at the interfaces which are given by the well known Fresnel formulae at the interface between two homogeneous media of refractive index $n_1$ and $n_2$:

$$r = \frac{n_1 - n_2}{n_1 + n_2};\qquad(4)$$

$$t = \frac{2n_1}{n_1 + n_2}$$

where, in the case of a grating, one refractive index has to be replaced by the effective index of the grating mode of each given polarization. The phase of the coefficients is also close to that of the homogenous media case (i.e. 0 for transmission and 0 or $\pi$ for reflection from a lower or higher index material, respectively). It is worth pointing out here that the present invention places itself in conditions where the above hypothesis on the phase of the field reflection and transmission coefficients does not hold, and it exploits the very deviation from this hypothesis to break the in-principle impossibility of the solution of the state of the art, to render the set of three conditions non-contradictory, and to satisfy the latter in a shallow, easily fabricable grating corrugation.

The Fabry-Perot concept can however still be used to approximately give the maximal achievable resonant power transmission $T_{max}$, in particular for the polarization transformers of the prior art for which this concept is a close to exact approximation. This maximal power transmission $T_{max}$ of a Fabry Perot with field reflectivities $r_c$ and $r_s$ at the cover and substrate interface, respectively, is given by:

$$T_{max} = \frac{(1-r_c)(1-r_s)}{\left(1-\sqrt{r_c r_s}\right)^2} \quad (5)$$

which only reaches 100% in the case of $r_c = r_s$ (called "symmetric" Fabry-Perot). Combining expressions (4) and equation (5) results in the maximal transmission under resonance which can be achieved in a Fabry-Perot made up of three different dielectric materials:

$$T_{max} = \quad (6)$$
$$\begin{cases} 4\dfrac{n_c n_s}{(n_{eff} + n_c n_s/n_{eff})^2} & \text{for } n_{eff} \text{ between } n_c \text{ and } n_s \\ 4\dfrac{n_c n_s}{(n_c + n_s)^2} & \text{for } n_{eff} \text{ larger or smaller than } n_c \text{ and } n_s \end{cases}$$

The mathematical expressions (6) reveal that there is a fundamental difference between two types of structures. On the one hand, if the effective index is between the cover and substrate index, a maximal power transmission of 100% can be obtained only for $n_{eff} = (n_c \cdot n_s)^{1/2}$. This implies that, for the devices of the state of the art for which expressions (6) are essentially valid, either the $TE_0$ or the $TM_0$ mode represents an asymmetric Fabry-Perot exhibiting notably less than 100% power transmission: only one of the polarizations can fulfill the condition of equal reflectivities and thus exhibit maximum transmission of 100% by having an effective index equal to $(n_c n_s)^{1/2}$, and thus representing a symmetrical Fabry-Perot; the other polarization necessarily forms a Fabry-Perot with different reflectivities at the two interfaces exhibiting a notably lower maximal transmission according to the first expression of (6). This is thus an inherent problem of the polarization transformers of the prior art since $n_{eff}^{TE0}$ and $n_{eff}^{TM0}$ for the zeroth order $TE_0$ and $TM_0$ modes must be different to give rise to the needed polarization phase difference. Thus, it is not possible for both polarizations to have a maximum transmission. This affects the quality and efficiency of the polarization transformation. On the other hand, if the effective index is larger or smaller than both substrate and cover index, the maximal transmission, as given by the second expression of (6), does not depend on the effective index in the Fabry-Perot model. For usual substrate materials it is rather large and close to 100% (e.g. 96% for $n_s = 1.5$ and an air cover).

The present invention places itself in the condition of the second expression of (6) for the TE-polarization, with a low index substrate material permitting the TE-polarization to "see" a non-symmetrical Fabry-Perot having a larger effective index of the grating region and thus exhibiting a maximum power transmission close to 100%. Furthermore, the present invention places itself at the same time in a condition where in the TM-polarization the difference between the $TM_0$ effective index and the substrate refractive index as well as the cover refractive index is very low, resulting also in a Fabry-Perot power transmission close to 100% whatever the Fabry-Perot height.

The present invention, after having identified the inherent problems of the devices of the prior art and the theoretical limitation of such devices by analyzing the physical behavior of a grating as a Fabry-Perot for the zero$^{th}$ order grating modes, discloses a device that overcomes these limitations, is easier to fabricate and performs as a high efficiency, high quality polarization transformer transforming a beam of linear polarization into a beam of radial and azimuthal polarization.

Thus, the present invention concerns a planar polarization transformer for a normally incident optical wave or beam having a given vacuum wavelength $\lambda$, comprising an optical planar grating between a cover medium of refractive index $n_c$ and an optical substrate of refractive index $n_s$ larger than the cover refractive index, this planar grating defining a binary index modulation or corrugation of substantially rectangular profile with periodic ridges, having a ridge refractive index $n_r$ and a ridge width $W_r$, and interleaved grooves having a groove width $W_g$ and groove refractive index $n_g$ equal to the cover refractive index $n_c$. The planar grating locally has a grating period $\Lambda$ which is smaller than the wavelength of the incident optical wave divided by the substrate refractive index ($\Lambda < \lambda/n_s$). The polarization transformer is characterized in that the ridge refractive index $n_r$ is larger than the substrate refractive index $n_s$, in that the grating period $\Lambda$ is larger than $0.4 \cdot \lambda/n_c$, in that the substrate refractive index $n_s$ is smaller than $2.7 n_c$, and in that the index modulation or corrugation is designed such that, according to the grating mode dispersion equation, the effective index of the TE fundamental grating mode $TE_0$ is larger than the substrate index $n_s$ and the effective index of the TM fundamental grating mode $TM_0$ is larger than the cover refractive index $n_c$ and smaller than the substrate index $n_s$.

In a particular embodiment, the substrate is composed of high thermal conductivity $MgF_2$ or sapphire or YAG. In a first variant of the invention, the cover and the grooves are filled with air or vacuum. In another variant, the cover and the grooves are filled with a transparent polymer or with a transparent liquid.

The invention also concerned a design method for a planar polarization transformer comprising an optical planar grating between a cover medium of refractive index $n_c$ and an optical substrate of refractive index $n_s$ larger than the cover refractive index, this planar grating defining a binary index modulation or corrugation of substantially rectangular profile with periodic ridges, having a ridge refractive index $n_r$ and a ridge width $W$ and interleaved grooves having a groove width $W_g$ and groove refractive index $n_g$ equal to the cover refractive index $n_c$, this planar grating locally having a grating period $\Lambda$ which is smaller than the wavelength $\lambda$ of an incident optical wave or beam divided by the substrate refractive index, said ridge refractive index $n_r$ being larger than the substrate refractive index $n_s$, this design method comprising the following step:

Choosing a wavelength $\lambda$;
Choosing a period $\Lambda$ in the range $0.4 \cdot \lambda/n_c < \Lambda < \lambda/n_s$;
Determining the duty cycle $D = W_r/\Lambda$ from the $TM_0$ dispersion equation of the modal theory to substantially realize $n_{e\!f\!f}^{TM0} = (n_c \cdot n_s)^{1/2} n_{e\!f\!f}^{TM0}$ being the effective index of the fundamental TM mode ($TM_0$) of the planar grating;

Determining $n_{e\!f\!f}^{TE0}$ from the TE dispersion equation of the modal theory for the chosen period and wavelength and the determined duty cycle D, $n_{e\!f\!f}^{TE0}$ being the effective index of the fundamental TE mode ($TE_0$) of the planar grating;

Calculation of the field reflection and transmission phases $\phi_r^{TE}$ and $\phi_t^{TE}$ of the $TE_0$ mode by means of the modal theory;

Calculation of a first height $H^{FP}$ from the expression $$H^{FP} = \frac{\lambda}{2\pi n_{e\!f\!f}^{TE}} (\pi - 1/2\phi_r^{TE})$$

Calculation of a second height $H^{dif}$ from the expression $$H^{dif} = \frac{\lambda}{2\pi (n_{e\!f\!f}^{TE} - n_{e\!f\!f}^{TM})} (\pi - \phi_t^{TE})$$

Calculation of the height average $H = (H^{FP} + H^{dif})/2$ defining the grating height;

According to an improvement of the design method given above, this method further comprises an optimization step in which a fine tuning of geometrical parameters (Λ, D and H) of the planar grating with an appropriate numerical optimization tool by taking as departure point the corresponding geometrical parameters obtained in the design method given above. In a particular variant, the numerical optimization tool defines a gradient search method using a merit function corresponding to the transmission of the incident optical wave or beam through two crossed polarizers with the grating arranged between them and oriented at 45° relative to each polarizer direction.

BRIEF DESCRIPTION OF THE FIGURES

The present invention will be described subsequently in more detail with reference to the attached drawing, given by way of examples, but in no way limited thereto, in which.

DETAILED DESCRIPTION OF THE INVENTION

Figure 1:
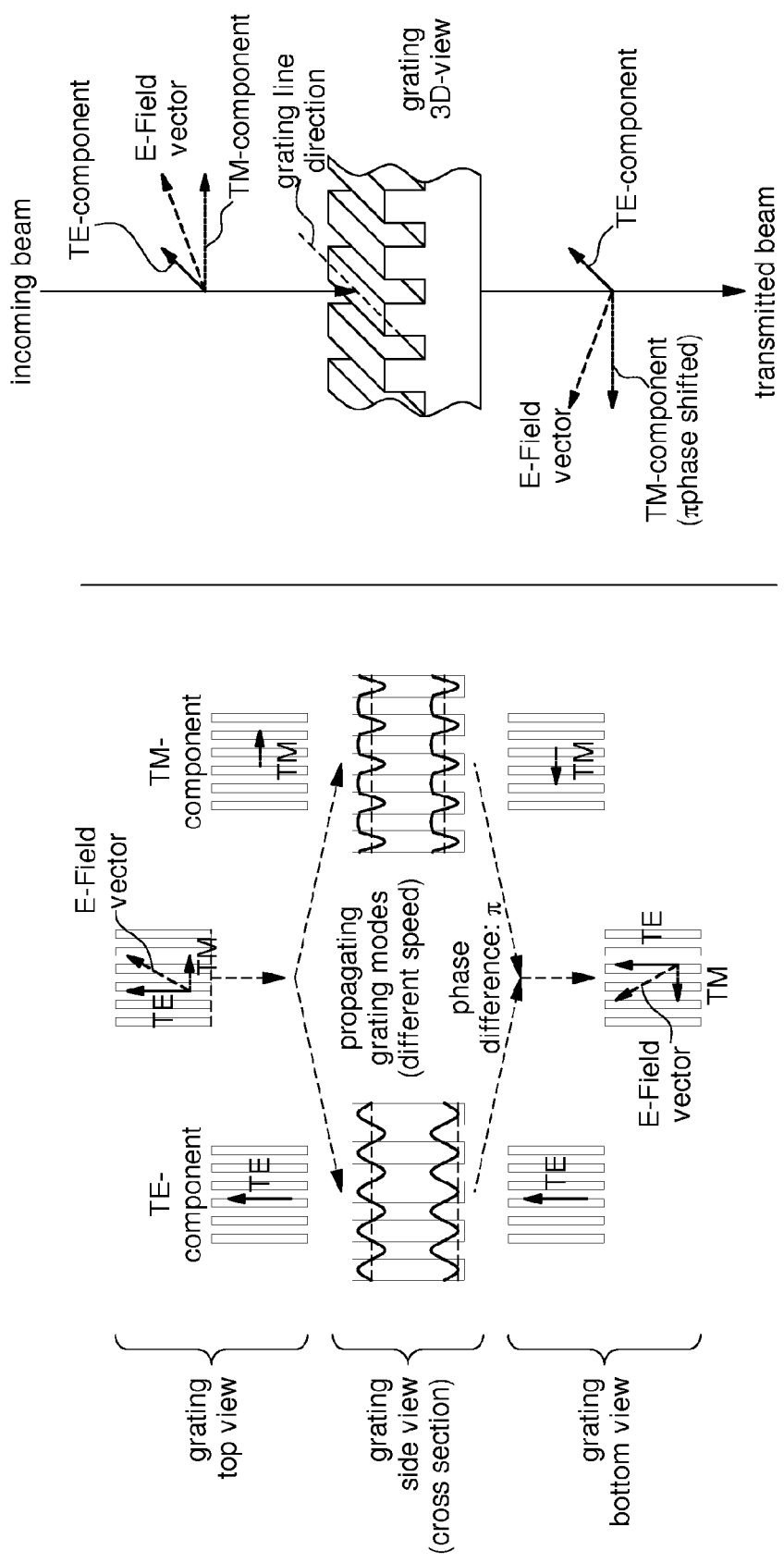
FIG. 1 illustrates the principle of linear polarization rotation by means of a subwavelength grating.
Figure 3:
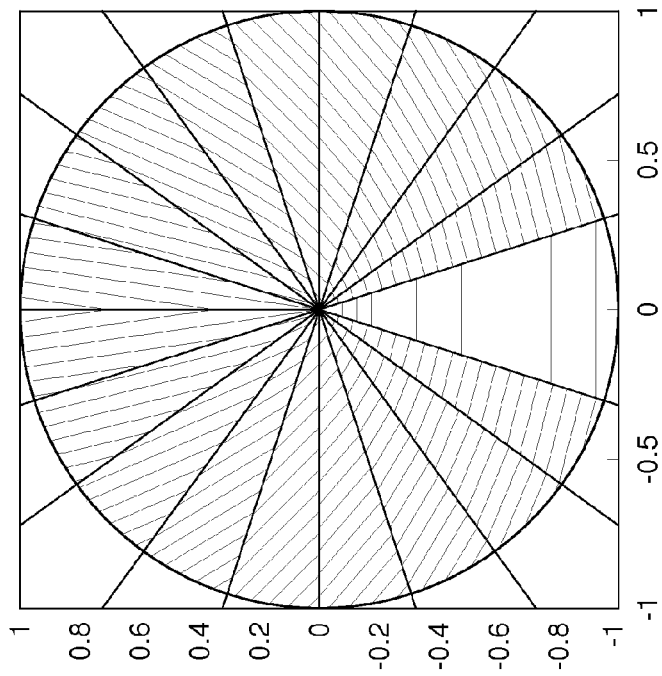
FIG. 3 is a top view of a segmented grating exhibiting a substantially constant period while substantially achieving the polarization transformation of the grating represented in FIG. 2.
Figure 2:
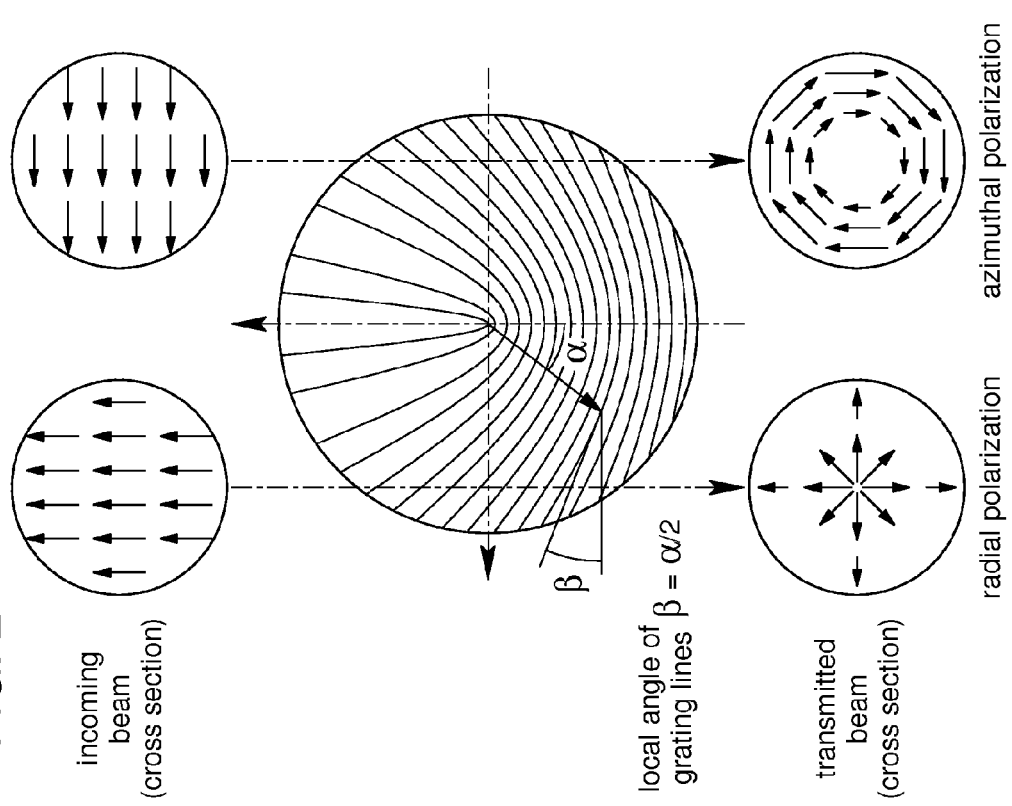
FIG. 2 is a top view illustrating the direction of the lines of a grating transforming an input linear polarization into a radial or azimuthal polarization.
Figure 4A:
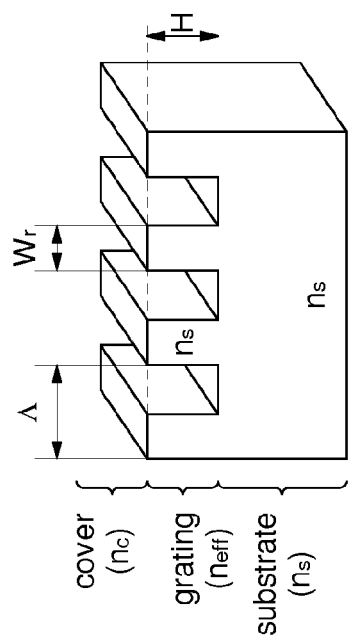
FIG. 4A partially shows a polarization transforming grating of the state of the art.
Figure 4B:
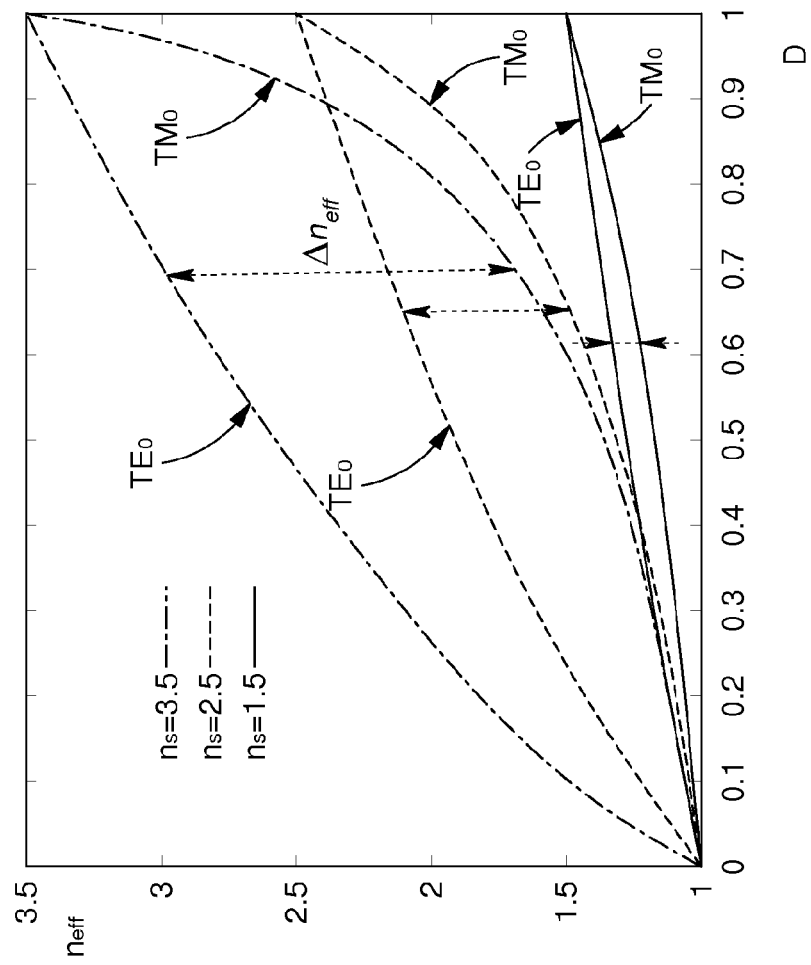
FIG. 4B is a graph showing the $TM_0$ and $TE_0$ grating mode effective index dependence versus the duty cycle of a polarization transforming grating of the state of the art for three different materials forming this grating.
Figure 5A:
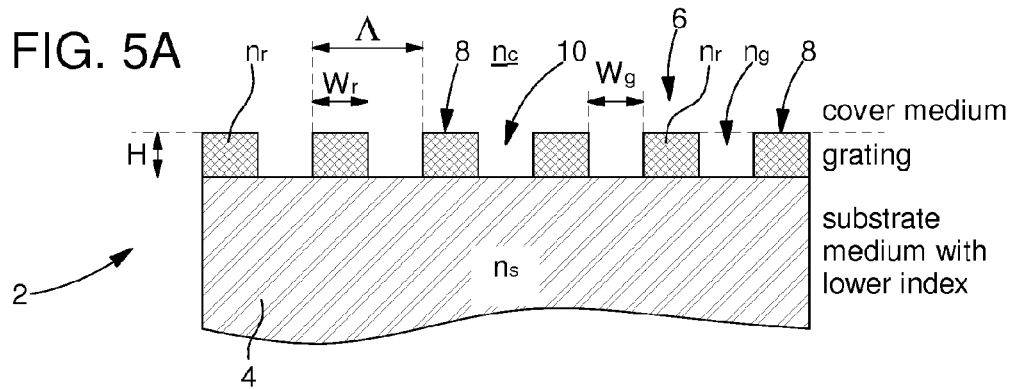
FIG. 5A is the cross-section of a first embodiment of a polarization transforming grating according to the invention.

A first embodiment of the invention is partially represented in cross-section in FIG. 5A. The polarization transformer 2 is intended for a light beam or light wave of a given wavelength λ in the optical domain arbitrarily defined as extending from 193 nm up to 20 micrometer vacuum wavelength. This polarization transformer is formed by a planar structure comprising a substrate 4 having refractive index $n_s$ and a grating 6 arranged on this substrate. The incidence of the light wave is substantially normal to the planar structure. It can however be off normal (typically up to 5 degrees), as long as no orders higher than the $0^{th}$ order appear in the substrate. The optical planar grating 6 defines a grating region (also named grating layer or grating medium or grating zone) and is formed by ridges 8 of width $W_r$ and grooves 10 of width $W_g$ forming a corrugation of substantially rectangular profile. This planar grating is located between a cover medium, having a refractive index $n_c$ smaller (or lower) than or equal to the refractive index of the substrate, and the substrate. According to the invention, the ridges 8 have a refractive index $n_r$ which is larger (or higher) than the refractive index $n_s$ of the substrate. The grooves have a refractive index $n_g$ smaller than the index of the ridges. In a preferred variant, the grooves are filled with the same medium as the cover medium, as air for instance. The planar grating has locally a grating period Λ which is smaller than the cutoff period, i.e. smaller than the wavelength of the incident light beam or wave divided by the refractive index $n_s$ of the substrate. The cutoff condition limits the diffraction of the light beam or wave by the grating into the substrate and the cover media to the sole zeroth ($0^{th}$)

reflected and transmitted diffraction orders. Further, the refractive index $n_r$ of the ridges, that of the grooves $n_g$, the period/wavelength ratio $\Lambda/\lambda$ and the duty cycle $D=W_r/\Lambda$ are selected, and the grating is designed so that the effective index of the fundamental $TE_0$ modes of the grating region, given by the dispersion equation of the modal theory [e.g., ref Tishchenko, A., "Phenomenological representation of deep and high contrast lamellar gratings by means of the modal method," Opt. Quantum. Electron., Springer 37, 309-330 (2005)), Equations (17) and (20)], is larger than the refractive index $n_s$ of the substrate.

Figure 5B:
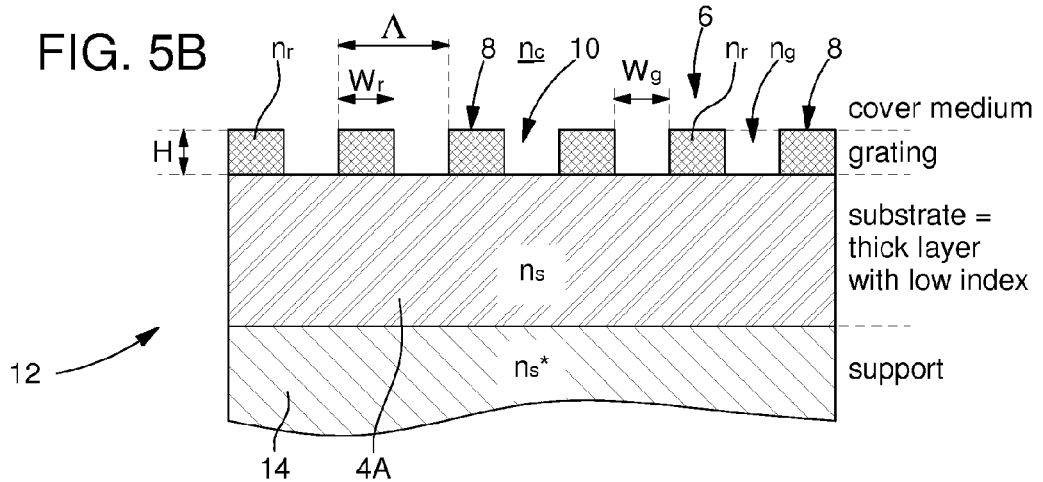
FIG. 5B is the cross-section of a second embodiment of a polarization transforming grating according to the invention with a thick layer optical substrate on mechanical support.

FIG. 5B shows a second embodiment of a polarization transformer 12 according to the invention wherein the transparent substrate is formed by a thick layer 4A of low index material like $ThF_4$ disposed on top of a mechanical substrate (support) of any transparent material, for instance ZnSe, having a larger index $n_s^*$ (in the case of ZnSe, the index value $n_s^*=2.403$ at $\lambda=10.6$ μm). The height of the thick layer is chosen so that the optical substrate actually "seen" by the light is essentially $ThF_4$ with $n_s=1.32$. Thus, the low index optical substrate is thick enough to preclude the tunneling of the $+/-1^{st}$ transmitted diffraction orders into the high index support through the low index optically thick substrate layer.

The evanescent $+1^{st}$ and $-1^{st}$ diffraction orders in the low index optical substrate of index $n_s$ have an exponential decay in the direction normal to the plane of the element. The factor in the exponential is $-z((\lambda/\Lambda)^2-n_s^2)^{1/2})2\pi/\lambda$ where z is the coordinate along the normal with origin at the basis of the grating corrugation. Preventing these diffraction orders from tunneling into the high index substrate through the low index optical substrate amounts to ensuring a field amplitude at the interface between the high index substrate and the low index optical substrate that is $\in$ times the field amplitude at the basis of the grating corrugation (at z=0), where $\in$ is a factor much smaller than 1; for instance equal to 0.1. Consequently, the thickness $t_{ob}$ of the low index optical substrate is given by: $t_{ob} > -\ln(\in)\lambda/(2\pi((\lambda/\Lambda)^2-n_s^2)^{1/2})$. A concrete value for $t_{os}$ will be given in the $3^{rd}$ example given hereunder.

The use of a low index substrates softens the condition on the grating period for having no propagating orders in the substrate ($\Lambda<\lambda/n_s$) and thus prevents diffraction losses in the substrate even for larger periods, compared to those used in the state of the art. The low index is achieved by using materials like $CaF_2$ ($n_s=1.51$ at 193 nm) or $MgF_2$, $SiO_2$ (about 1.46 in the visible and near-IR range), $ThF_4$ ($n_s=1.32$ in the far IR, in particular at 10.6 μm wavelength) for instance. The choice of the substrate can be imposed by thermal conditions if the incident beam or wave has a large power. In this case it is preferable to use a $MgF_2$ or sapphire or YAG substrate instead of a fused quartz substrate because of their large thermal conductivity, and a heat sink of adequate geometry. The corrugated grating layer is of high index against the cover and groove index to give rise to a large birefringence between the $TE_0$ and $TM_0$ grating modes, and thus to limit the needed groove depth to accumulate the transmission phaseshift of $\pi$ between the TE and TM Fabry-Perot field transmissions. This high index material can e.g. be amorphous silicon as from 0.7 μm wavelength (where it becomes transparent) upwards, single crystal silicon of the SOI technology, germanium, GaAs, InP, or GaN at wavelengths larger than that corresponding to their gap for instance.

According to the invention, for fixed refractive indexes and period/wavelength ratio, the duty cycle D of the corrugation is first selected so as to define an effective index of the $TM_0$ mode equal to $(n_c \cdot n_s)^{1/2}$ in order to have the maximal power transmission through the polarization transformer according to the result given by the first expression of (6) in the summary of the invention. This is made by solving the dispersion equation (equation (20) of Tishchenko's reference given above) to create a plot of the effective index of $TM_0$ over the duty cycle D, which is presented in FIG. 8 for an example with $n_s=1.44$, $n_r=3.7$ and $\Lambda=0.8\lambda/n_s$, and subsequently choosing a suitable duty cycle to fulfill the first of expressions (6). So small a $TM_0$ effective index is obtained with a duty cycle smaller than 0.25, i.e. the grooves are wider than the ridges. This is an important advantage over the state of the art because it is technologically much easier to photolithographically transfer and to dry-etch grooves that are wider than the ridges than the opposite. The assumption that the $0^{th}$ mode only is responsible for the grating transmission is not as accurate as at very small periods since the decay of the next higher order TE grating mode field, which is evanescent, can penetrate deep enough into the grating layer, and its energy tunnels through it into the substrate. To avoid this situation where the grating transmission becomes unpredictable the condition is stated that the field of the $TE_2$ mode at the bottom of the corrugation is less than 20% of its amplitude at the air-corrugation interface. The model of considering the $0^{th}$ order only holds well enough to serve as an explanatory model of the device of the invention as well as to approximately define its operation conditions.

Figure 6:
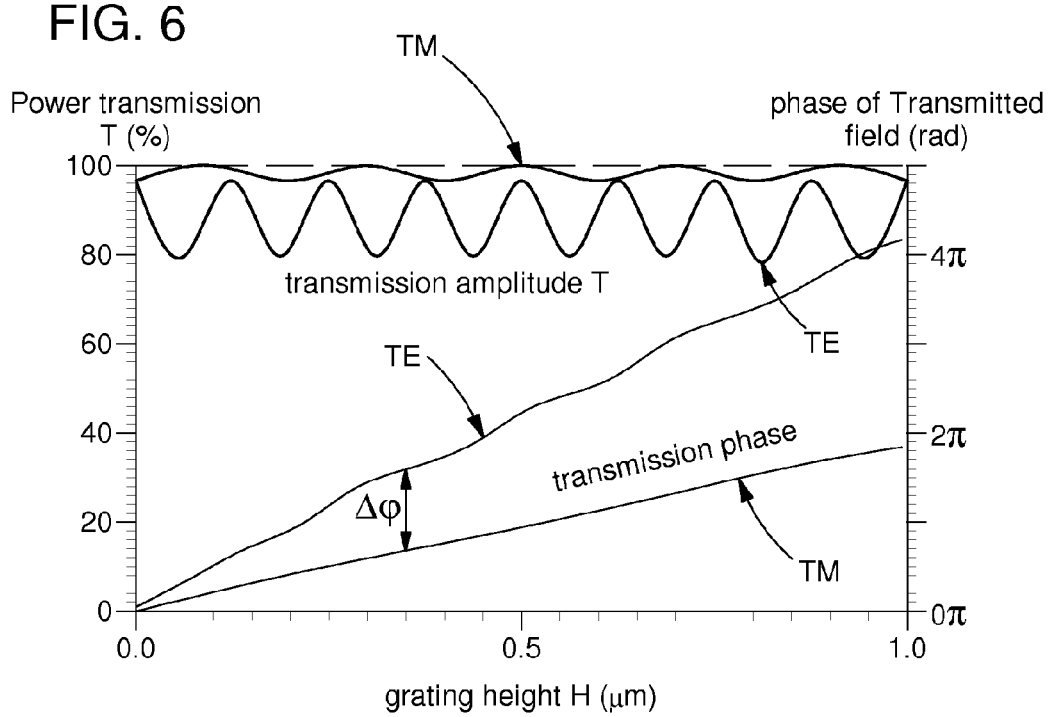
FIG. 6 is a graph showing the TE and TM power transmission and the TE and TM field transmission phase of the Fabry-Perot for the $TE_0$ and $TM_0$ mode (using $n_s=1.44$, $n_c=1.0$, $n_{e\!f\!f}^{TM0}=1.2$ and $n_{e\!f\!f}^{TE0}=2.0$) versus the height H of the grating.

Having assigned to D the value giving the $TM_0$ mode the effective index $n_{eff}^{TM0}=(n_c n_s)^{1/2}$, the TM Fabry-Perot is symmetric and consequently has a maximum power transmission of 100%, but contrary to the devices of the state of the art, this effective index is very low (typically 1.22 with an air cover and a $SiO_2$ substrate), and close to the substrate as well as the cover index, so that the reflectivity for both interfaces of the respective Fabry Perot is very small (see Expressions (4)), which implies that close to 100% power transmission is achieved whatever the depth H (height) of the corrugation as shown in FIG. 6 where the typical behavior of a Fabry-Perot is represented versus H as an example wherein the effective index of the TM grating mode of zero$^{th}$ order $n_{eff}^{TM0}=1.22$ and the effective index of the TE mode of zero$^{th}$ order $n_{eff}^{TE0}=2.0$. Thus, in the device of the invention the requirement of close to 100% TM power transmission does not place any condition on the height H of the grating corrugation. The latter can consequently be freely chosen to adjust the resonance of the TE Fabry-Perot and the π-phase difference between the TE and TM field transmissions. It is important to point out here that $n_{eff}^{TM0}$ is so low that the next order $TM_2$ grating mode is strongly evanescent and practically does not affect the phase and amplitude of the TM field transmission coefficients across the two interfaces of the corrugated region with the cover and the substrate. On the contrary, as FIG. 6 shows, the power transmission of a Fabry-Perot with a layer having a refractive index value=2.0, corresponding to the TE polarization, is significantly dependent on the grating height H. In this last case, the power transmission varies approximately between 80% and 96%. Thus, the grating height is a critical parameter for the power transmission of the TE polarization component and has to be selected so as to be in the region of a maximum of the TE power transmission curve. FIG. 6 also shows the phase of the field transmission of the Fabry-Perot for both refractive indexes, i.e., for both polarizations. The phase dependence of both polarizations on the height H is an important feature of the polarization transformer since it is their phase difference (which must here be π) as much as their amplitude difference that determines the transmitted polarization state. The phase of the TM field transmission across the TM Fabry-Perot is quasi-linearly dependent on the height H of the grating and the TE transmission phase is only weakly modulated around a straight line. It will be shown hereunder that this property remains substantially true in the device of the invention where the grating period is close to the wavelength, with the consequence that both TM and TE transmission phases can be approximated by a straight through transmission (linear dependency on grating height).

In the device of the invention, the $TE_0$ effective index is larger than the substrate index $n_s$, thus according to the second of expressions (6) the maximal transmission does not depend on the absolute value of the refractive index $n_r$ of the high index grating layer and of the effective index of this grating layer, but only on $n_s$ and $n_c$, which in the example of a fused silica substrate and air cover gives a maximum power transmission of approx. 96% for the TE Fabry-Perot.

The quasi-100% TM Fabry-Perot transmission condition being fulfilled whatever H, two conditions remain to be fulfilled: first, one roundtrip of the $TE_0$ grating mode must result in a phaseshift of $m_{FP} \cdot 2\pi$ to give constructive interference in the TE Fabry-Perot field transmission and, secondly, the phase difference between the transmission for TE and TM polarizations must amount to $(2m_{dif}-1) \cdot \pi$ to give the desired phase shift between TE and TM field transmissions ($m_{FP}$ and $m_{dif}$ are integer numbers). Since the grating should be as shallow as possible to ease the fabrication, and since the phaseshift is substantially proportional to the height of the grating, the integer numbers $m_{FP}$ and $m_{dif}$ should be as small as possible, i.e. equal to 1.

Figure 7:
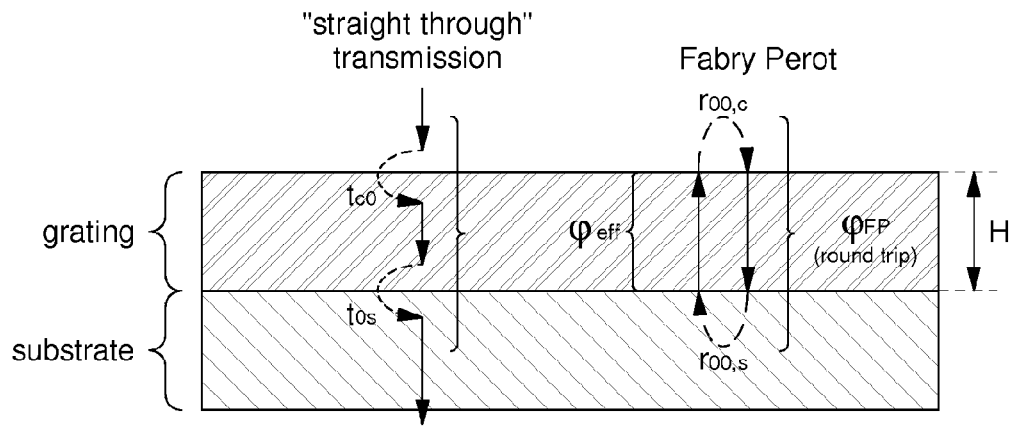
FIG. 7 is an explanatory sketch defining the amplitudes and phases of the field transmission and reflection coefficients considered for defining the geometrical parameters of the polarization transforming grating of the invention.

FIG. 7 defines the field transmission and reflection coefficients, as well as the phase values for the transmission through the grating layer ($\phi_{eff}$), through the whole grating ($\phi_{straight}$) and for a Fabry-Perot roundtrip ($\phi_{FP}$).

At this point, the very fact of using a period larger than in the state of the art permits to make use of a not yet explicitly disclosed property of a relatively large period grating for obtaining a solution with a Fabry-Perot roundtrip of $2\pi$ and a TE-TM phase difference of $\pi$ (i.e., $m_{FP}$ and $m_{dif}$ having the smallest value which their definition permits, i.e., 1). Whereas a relatively large period might dangerously lead to the excitation of a spurious higher order propagating grating mode or, in the present case of a weakly evanescent mode, there is a modal operation range where there is still only one propagating mode, the fundamental $TE_0$ mode (the $TM_0$ case being already settled), but where the excitation of the weakly evanescent higher order mode(s) by the incident wave affects the phase of the field reflection and transmission coefficients of the fundamental $TE_0$ mode at this interface. The larger the decay length of the higher order evanescent mode, the longer the life time of the photons coupled into the latter, the stronger the effect of the latter on the $TE_0$ reflection and transmission coefficients, mainly on their phase. Under such conditions of relatively large period the phase of these coefficients can be widely different from 0 and $\pi$ and this difference can be explicitly used to intervene in the transmission phaseshift condition between TE and TM polarization components, and in the TE Fabry-Perot roundtrip condition, resulting in the possibility of satisfying them both with the smallest possible combination of $\pi$-phaseshift and $2\pi$-roundtrip phase multiples. This will be explained hereunder.

To this end let us define the total phase of the $TE_0$ field reflection coefficients ($\phi_r$) resulting from a round trip in the Fabry-Perot, and of the transmission coefficients ($\phi_t$) resulting from crossing the Fabry-Perot from the cover to the substrate:

$$\phi_r^{TE} = \arg(r_{00,c}^{TE}) + \arg(r_{00,s}^{TE}); \phi_t^{TE} := \arg(t_{c,0}^{TE}) + \arg(t_{0,s}^{TE}) \quad (8)$$

and for $TM_0$:

$$\phi_{TM} = \arg(r_{00,c}^{TM}) + \arg(r_{00,s}^{TM}); \phi_t^{TM} := \arg(t_{c,0}^{TM}) + \arg(t_{0,s}^{TM}) \quad (9)$$

where $r_{00,c}$, $r_{00,s}$, $t_{c,0}$ and $t_{0,s}$ are the field reflection and transmission coefficients at the cover-grating and grating-substrate interfaces (see FIG. 7 for their definition). These coefficients are calculated by using the modal theory (Appendixes A and B of Tishchenko, A., "Phenomenological representation of deep and high contrast lamellar gratings by means of the modal method," Opt. Quantum. Electron., Springer 37, 309-330 (2005)).

Furthermore, the phase-shift $\phi_{eff}$ resulting from the $0^{th}$ order mode propagation through the grating region with its effective index $n_{eff}$ is given by:

$$\varphi_{eff}^{TE} = \frac{2\pi}{\lambda} n_{eff}^{TE_0} H; \quad (10)$$

$$\varphi_{eff}^{TM} = \frac{2\pi}{\lambda} n_{eff}^{TM_0} H$$

which leads to the phase of the complete transmission, called "straight through" phase (FIG. 7), as:

$$\phi_{straight}^{TE} = \phi_t^{TE} + \phi_{eff}^{TM}; \phi_{straight}^{TM} = \phi_t^{TM} + \phi_{eff}^{TM} \quad (11)$$

The phase of the transmission through the grating should include the contribution of the multiple Fabry-Perot round trip reflections. However, the finesse of such Fabry-Perot is so small that considering just one round trip is a sufficient approximation.

Following the rationale described above, the two conditions to be fulfilled are the Fabry-Perot roundtrip for the TE polarization:

$$\phi_{FP}^{TE} = m_{FP} 2\pi \quad (12)$$

and the phase difference between TE and TM upon a single path through the Fabry-Perot:

$$\Delta\phi = \phi_{straight}^{TM} - \phi_{straight}^{TM} = (2m_{dif}-1)\pi \quad (13)$$

This in itself already represents a first major step ahead of the state of the art solution since the close to 100% condition for the TM power transmission is satisfied regardless of the above two remaining conditions. At this point it is interesting to write conditions (12) and (13) in the case of a period/wavelength ratio notably smaller than 1 (state of the art situation) and with an effective index of $TE_0$ and $TM_0$ located between substrate and cover index (as is the case of the state of the art), which means that the phase of the TE field transmission coefficients are close to 0, whereas the field reflection coefficients are 0 and $\pi$ at the cover and substrate interface, respectively: it would in this case be impossible to satisfy conditions (12) and (13) with the lowest possible combination of $m_{FP}=1$ and $m_{dif}=1$ since this would imply that the phase of the TM single path phase $\phi_{straight}^{TM}$ is zero which is impossible because the grating region has a non-zero thickness. With $m_{FP}>1$ the depth H of the grating corrugation becomes large and difficult to fabricate. This is precisely where the choice of a larger period characteristic of the present invention reveals to permit a breakthrough: not only can a large period grating be more easily fabricated than a short period grating, but, in addition and most importantly, a larger period leads to reflection and transmission phase shifts that deviate notably from 0 and $\pi$ and enables the satisfaction of conditions (12) and (13) with $m_{FP}=1$ and $m_{dif}=1$ which ensures the operation of the polarization transformer with the shallowest possible grating as described hereafter.

Let us first consider the reflection coefficients of the $0^{th}$ order grating mode at the grating-cover and at the grating-substrate interfaces within binary gratings with period close to the cutoff of the grating mode next to the fundamental mode the decay of the evanescent field of the higher order evanescent grating modes and higher order evanescent diffraction orders is slower than in short period gratings. These evanescent modes and diffraction orders do not carry energy, but they act as a temporary energy reservoir. The $0^{th}$ grating mode, impinging on one of the interfaces, couples to these evanescent modes and diffraction orders and transfers some energy into them. This energy is returned back to the $0^{th}$ grating mode with a phase retardation, i.e. a negative phase shift. This is analogous to the known Goos-Hänchen shift occurring under total reflection at the interface between two dielectric media. Thus, the reflection coefficients always have a negative phase instead of close to zero as in short period gratings.

No general prediction about the sign of the phase of the field transmission coefficients is possible. However, repeated rigorous calculations show that in the TE case they are usually positive and only in some extreme cases (extremely small duty cycle, very large substrate index) become slightly negative. In the TM case, as already underlined previously, the field transmission coefficient phases are extremely small in the area of interest and can be set to zero, since the effective index is very small.

This general behavior of the phases of the field reflection and transmission coefficients does permit the satisfaction of conditions (12) and (13) with the smallest possible integer numbers $m_{FP}=1$ and $m_{dif}=1$: since the sign of the TE field reflection coefficients is negative, condition (12) is satisfied with $m_{FP}=1$ provided the TE Fabry-Perot thickness is larger than a half-wave thickness. Condition (13) can therefore in turn be in principle satisfied with $m_{dif}=1$ since the first term is larger than $\pi$ (all the more so as the phase of the TE field transmission coefficients is positive) and since the straight through TM phase $\phi_{straight}^{TM}$ is smaller than $\phi_{straight}^{TE}$ (because the phase of the TM transmission coefficients is close to zero and because the $TM_0$ mode effective index is notably smaller than the $TE_0$ mode effective index). Thus, given that the straight through transmission for TE has a phase of $\pi+x$ with x being positive, a straight through phase for TM of x results in a TE/TM phase shift of $\pi$.

Hereafter, an explicit design method for the novel polarization transforming grating is disclosed. It is assumed that $n_s$, $n_c$ and $n_r$ are given. The wavelength needs not be given because all three geometrical parameters $\Lambda$, $W_r$ and H are scalable relative to the wavelength $\lambda$ as the material dispersion is neglected.

First, the TM-effective index is chosen close to the value realizing a symmetric Fabry-Perot for the TM polarization:

$$n_{eff}^{TM} = \sqrt{n_c n_s} \quad (14)$$

Figure 8:
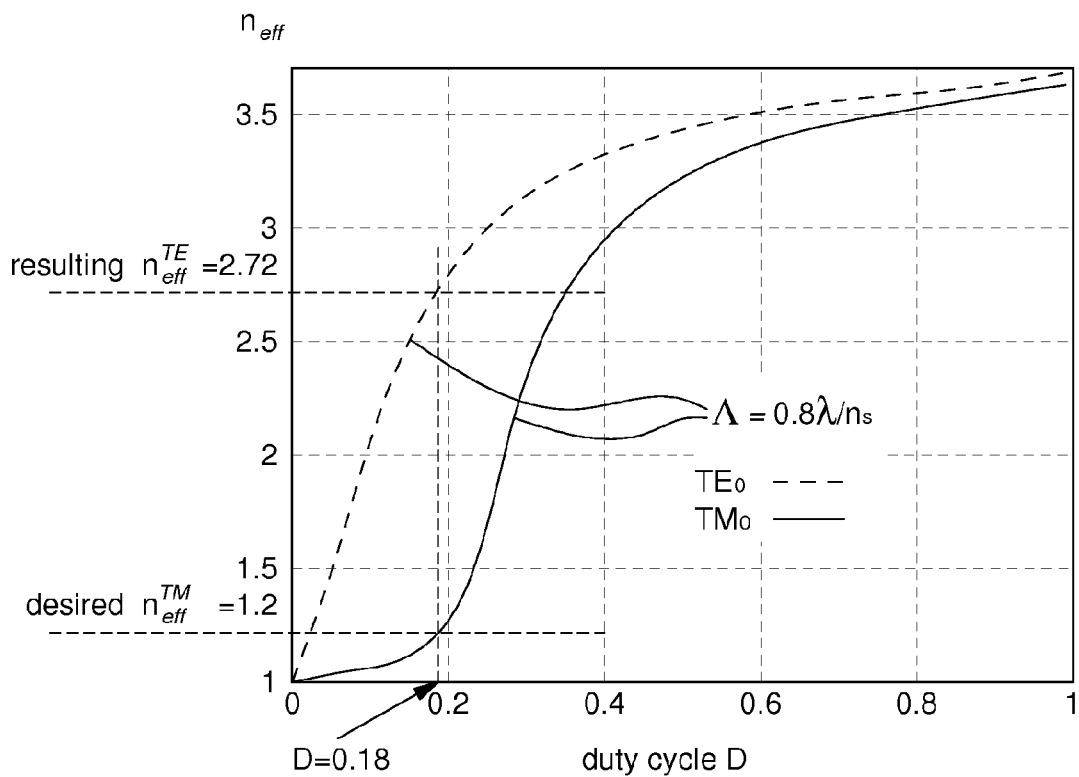
FIG. 8 is a graph showing the $TM_0$ and $TE_0$ grating mode effective index dependence versus the duty cycle $D=W_r/\Lambda$ of a polarization transforming grating of the invention.

Expression (14) imposes through the TM grating mode dispersion equation a condition on the period $\Lambda$ and the duty cycle D. The period is preliminarily fixed at a value according to the rationale of the invention, e.g. $\Lambda=0.8\lambda/n_s$. Substituting this period into the TM dispersion equation straightforwardly delivers the related duty cycle D. Introducing then these $\Lambda$ and D values into the TE grating mode dispersion equation straightforwardly delivers the corresponding $TE_0$ effective index (FIG. 8). The modal method is now used to calculate the reflection and transmission coefficients required in Equation (8) to calculate $\phi_r^{TE}$ and $\phi_t^{TE}$.

Now, setting $m_{FP}=1$ in Equation (12) and $m_{dif}=1$ in Equation (13), their combination with Equations (8) to (11) leads to the following two equations for two heights $H^{FP}$ and $H^{dif}$ of the grating, which fulfill the Fabry Perot condition (12) and the phase difference condition (13), respectively:

$$H^{FP} = \frac{\lambda}{2\pi n_{eff}^{TE}}(\pi - 1/2\phi_r^{TE}); \quad (15)$$

$$H^{dif} = \frac{\lambda}{2\pi(n_{eff}^{TE} - n_{eff}^{TM})}(\pi - \phi_t^{TE})$$

Those two heights which separately satisfy two different conditions (12) and (13) are not necessarily equal, as the period was assigned some value that might not be optimal for the desired function of the polarization transforming grating. However, for the chosen value of $\Lambda=0.8\lambda/n_s$ the two values of the height are close to each other since the chosen period is located in the period domain where the phases of the $TE_0$ reflection and transmission coefficients enable the possible fulfillment of both Fabry-Perot and phase difference conditions with the least values of $m_{FT}$ and $m_{dif}$. Thus, defining the height of the polarization transformer grating as the arithmetic mean of the two heights $H^{FP}$ and $H^{dif}$ of the expressions in (15) defines with the chosen period and related duty cycle a structure which is in the neighborhood of the optimum structure. The difference between $H^{FP}$ and $H^{dif}$ is a measure of how close to the optimal geometrical structure the initial guess on the period was. In case this difference is obviously too large, the design is resumed with another period (preferably between $\Lambda=0.7\lambda/n_s$ and $\Lambda=0.95\lambda/n_s$) or/and a slightly different $TM_0$ effective index.

Three examples of polarization transformer according to the invention are given hereafter, in a non limiting way, in the case of air or vacuum in the cover medium and grooves.

In the first example the substrate is made of fused silica ($n_s=1.44$) and the grating ridges made of amorphous silicon ($n_r=3.7$ for a wavelength of $\lambda=1030$ nm). According to the design method laid out above, the following steps are applied to obtain the required grating parameters:

Equation (14) gives the effective index of the $0^{th}$ order grating mode for the TM polarization:

$$n_{eff}^{TM0}=1.2$$

The grating period is set to a typical value below the largest possible period according to the cutoff condition (see Equation (1)):

$$\Lambda=0.8\lambda/n_s=591 \text{ nm}$$

The resolution of the $TM_0$ mode analytical dispersion equation gives the duty cycle providing $n_{eff}^{TM0}=1.2$:

$$D=0.18$$

corresponding to a ridge width of $W_r = D \cdot \Lambda = 106$ nm.

The resolution of the $TE_0$ dispersion equation with $D=0.18$ and $\Lambda=591$ nm gives $$n_{eff}^{TE0}=2.72$$

With the grating parameters $D=0.18$ and $\Lambda=591$ nm, the phase of the $TE_0$ reflection and transmission coefficients at the cover and substrate interfaces are calculated via the modal method (e.g. MCGrating by Nikolay Lyndin; http:/www.mcgrating.com):

$$\arg(r_{00,c}^{TE})=0.19\pi, \arg(r_{00,s}^{TE})=0.28\pi, \arg(t_{c,0}^{TE})=0.04\pi, \arg(t_{0,s}^{TE})=0.07\pi,$$

Which leads, using Equation (8), to $$\phi_r^{TE}=0.4\pi, \phi_t^{TE}=0.11\pi$$

(This confirms for this example the assumptions about the required signs of the phase shifts).

Equation (15) is now used to calculate the two necessary heights of the grating to give maximal transmission of the $TE_0$ Fabry Perot ($H^{FP}$) and to give a phase shift of $\pi$ between TE and TM ($H^{dif}$):

$$H^{FP}=241\ nm, H^{dif}=311\ nm$$

of which the average gives an approximate grating height:

$$H=276\ nm$$

The difference of the optimal values of H for TE Fabry Perot transmission and TE-TM phase shift from the average is approx. 10%. If this deviation was notably larger, for instance 25%, the design process would be resumed with another period, e.g. $0.7\lambda/n_s$ and $0.9\lambda/n_s$ until the difference between the resulting $H^{FP}$ and $H^{dif}$ is smaller than e.g. 20% of their average.

The derived grating has the geometrical parameter $$\Lambda=591\ nm, W_r=106\ nm, H=276\ nm$$

This grating exhibits 85.7% TE and 97.9% TM power transmissions, while giving a phaseshift between TE and TM field transmissions of $0.999\cdot\pi$. Thus, it shows the desired effect, its performance is better than the state of the art, and the grating parameters are much more relaxed due to the larger grating period and the greatly reduced groove aspect ratio.

In a second example at 1064 nm wavelength the substrate material is $MgF_2$=1.38), and the grating is made of $TiO_2$ ($n_r$=2.74). The same method gives in brief:

the required effective index of $TM_0$ according to Eq. (14) is $n_{eff}^{TM0}=1.17$ with $\Lambda=0.8\lambda/n_s=617$ nm, this $n_{eff}^{TM0}$ is obtained with D=0.20 ($W_r$=132 nm)

with these duty cycle and period, the effective index of the $TE_0$ mode is $n_{eff}^{TE0}=1.94$ the required phases from Eq. (9) amount to $\phi_r^{TE}=-0.47\pi$ and $\phi_t^{TE}=0.05\pi$ using Equation (15) the required grating heights are $H^{FP}=339$ nm, $H^{dif}=902$ nm.

In this case the difference between the two heights required for $TE_0$ Fabry Perot transmittance and the TE-TM phase difference is obviously too large. The design procedure is resumed with a period closer to $\lambda/n_s$. $\Lambda=0.95\lambda/n_s$ which leads to $H^{FP}=347$ nm and $H^{dif}=458$ nm.

Consequently, the approximate geometrical parameters of the polarizing device for this choice of materials are:

$$\Lambda=694\ nm, W_r=132\ nm, H=402\ nm$$

This grating transmits 86.1% in TE and 97.3% in TM, while giving a phaseshift between TE and TM of $1.087\pi$.

The third example is a polarization transformer for the infrared region ($\lambda$=10.6 μm), made of a $ThF_4$ optical substrate ($n_s$=1.32) with a Germanium grating on top ($n_r$=4.01). This optical substrate is a $ThF_4$ layer of thickness $t_{ob}$ larger than 3.3 μm between the Germanium corrugation and a larger index substrate, ZnSe in general. Following again the design method above a period of $0.75\lambda/n_s$ gives the approximate structure of the polarization transformer for a $CO_2$ laser beam:

$$\Lambda=6023\ nm, W_r=903\ nm, H=2526\ nm$$

This grating transmits 95.0% in TE and 99.2% in TM, while giving a phaseshift between TE and TM of $0.96\pi$.

In the infrared, at 10.6 μm wavelength, the device of the invention cannot have a substrate all made of $ThF_4$. A hard transparent substrate (support) is needed which is usually ZnSe. It is consequently advantageous to insert a thick layer of low index $ThF_4$ between the high index layer of germanium and the rather large index mechanical ZnSe substrate. The $ThF_4$ optical substrate must be thick enough to prevent the tunneling of the +/−1st diffraction orders into the ZnSe substrate through the $ThF_4$ optical substrate. Considering the just determined device of the invention with $\Lambda$=6032 nm, $n_s$=1.32, and $\lambda$=10.6 μm, and assuming a maximum acceptable ratio $\in$ between the field at the $ThF_4$/ZnSe interface and that at the bottom of the Ge-corrugation, the optical substrate thickness $t_{ob}$ must be $t_{ob}>-1.45\ \ln(\in)$. Assuming $\in$<0.1, the optical substrate thickness must be larger than 3.33 μm, which is easily fabricable.

The presented examples show that the disclosed method based on the simple model of $0^{th}$-order Fabry Perot transmission with $m_{FP}=1$ and $m_{dif}=1$ permits to identify the grating parameter space where the solutions of the invention lie. During the invention synthesis process some approximations were made (e.g. neglecting the contribution of higher order grating modes in the transmission, neglecting the Fabry Perot effect on the transmission phase) in order to provide an intelligible physical vision of the device operation. This led to the semi-analytic results of Equations (14) and (15), which determine the grating parameters. The two heights in Equation (15) fulfill separately the Fabry Perot condition for TE and the phase difference between TE and TM polarizations; their difference is the criterion for how far the approximate device structure is from the optimal structure; it therefore permits to tune the structure for its operation closer to the specified polarization function.

Now as the design method, based on the identification of the parameter space where solutions exist with the least values of $m_{FP}$ and $m_{dif}$, is set up its results can next be considered as the input data for a numerical search for the $\Lambda$, D and H set of parameters leading to the best performance of the polarization function. This search amounts to optimizing a merit function constructed on the basis of the operation of the device of the invention. One possible and very well adapted merit function is the transmission through crossed polarizers, one positioned in front of the polarization transforming grating and one behind it, where the grating is oriented 45° relative to the input polarizer. Only a perfect $\pi$-phase-shift and a power transmission of 100% for both TE and TM polarization components results in a transmission through the crossed polarizers equal to 100% while a different phaseshift and/or a reduction of the transmission will reduce this value. Such a merit function is for example available as an output format option of the program MCGrating by Nikolay Lyndin (http://www.mcgrating.com) based on the well known and widely used RCWA or on the true-mode method.

Applying this numerical optimization to the three above examples gives the best performance achievable with each set of refractive indexes (Power transmission $T_{TE}$ of the TE and $T_{TM}$ of the TM polarizations as well as the TE-TM phase shift $\Delta\phi$), and the related geometrical parameters:

Example 1 (amorphous silicon corrugation on a fused silica substrate at 1030 nm wavelength):

$\Lambda$: 591 nm→597 nm, $W_r$: 106 nm→105 nm, H: 276 nm→245 nm $T_{TE}$: 85.7%→98.1%, $T_{TM}$: 97.9.0%→98.3%, $\Delta\phi$: 0.99π→1.03π

Example 2 ($TiO_2$ grating on a $MgF_2$ substrate at 1064 nm wavelength):

$\Lambda$: 694 nm→733 nm, $W_r$: 132 nm→146 nm, H: 402 nm→367 nm $T_{TE}$: 86.1%→88.9%, $T_{TM}$: 97.3%→97.3%, $\Delta\phi$: 1.08π→1.03π

Example 3 (Ge grating on a ThF$_4$ substrate at 10.6 μm wavelength):
Λ: 6023 nm→6012 nm, W$_r$: 903 nm→971 nm, H: 2526 nm→2340 nm T$_{TE}$: 95.0%→99.5%, T$_{TM}$: 99.2%→99.3%, Δϕ: 0.96π→1.01π

Figure 9:
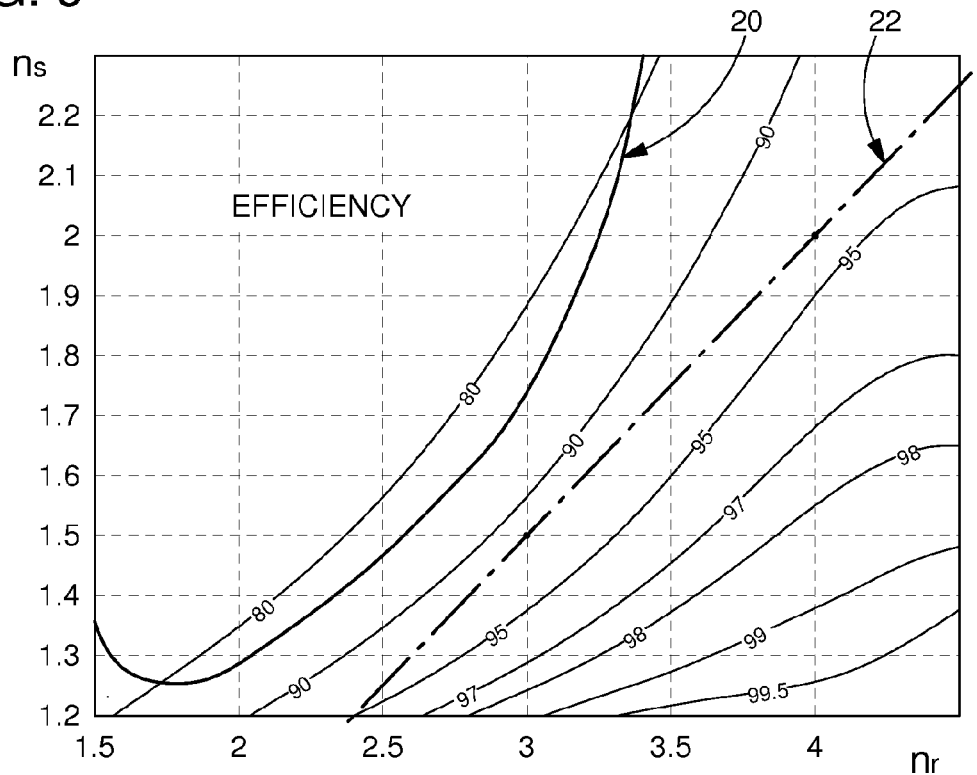
FIG. 9 is a graph showing the transmission through crossed linear polarizers versus the ridge index $n_r$ and substrate index $n_s$ for the optimized polarization transformer gratings of the invention, and a selected area of validity for the polarization transforming gratings of the invention in the $n_r$-$n_s$ space.
Figure 12:
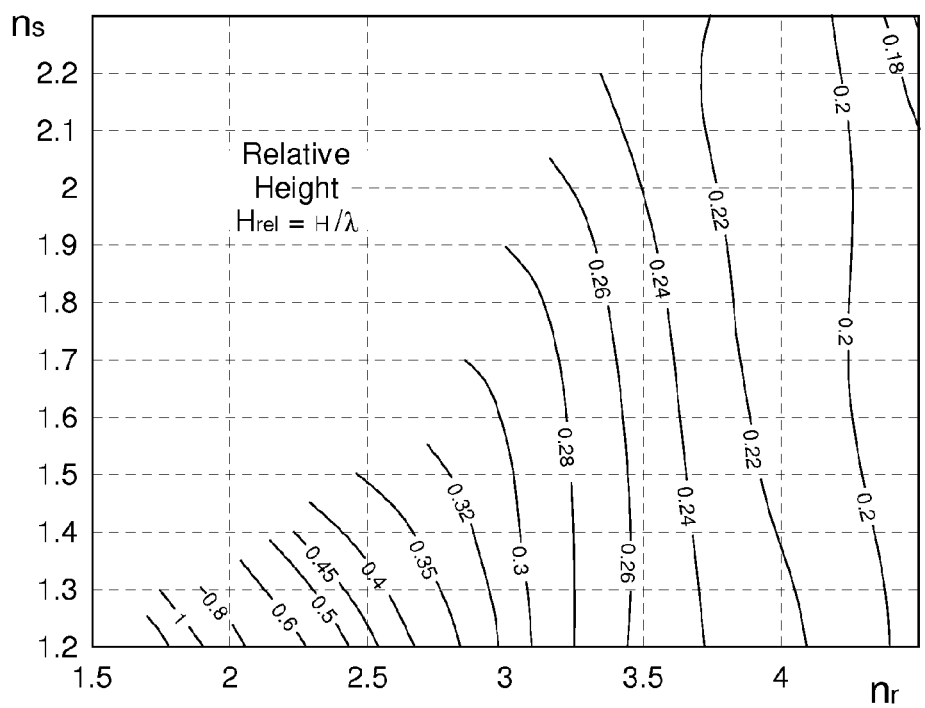
FIG. 12 shows the relative height $H_{rel}=H/\lambda$ of the optimized polarization transforming gratings versus the refractive indexes of ridge $n_r$ and substrate $n_s$ in the selected area of FIG. 9.
Figure 13:
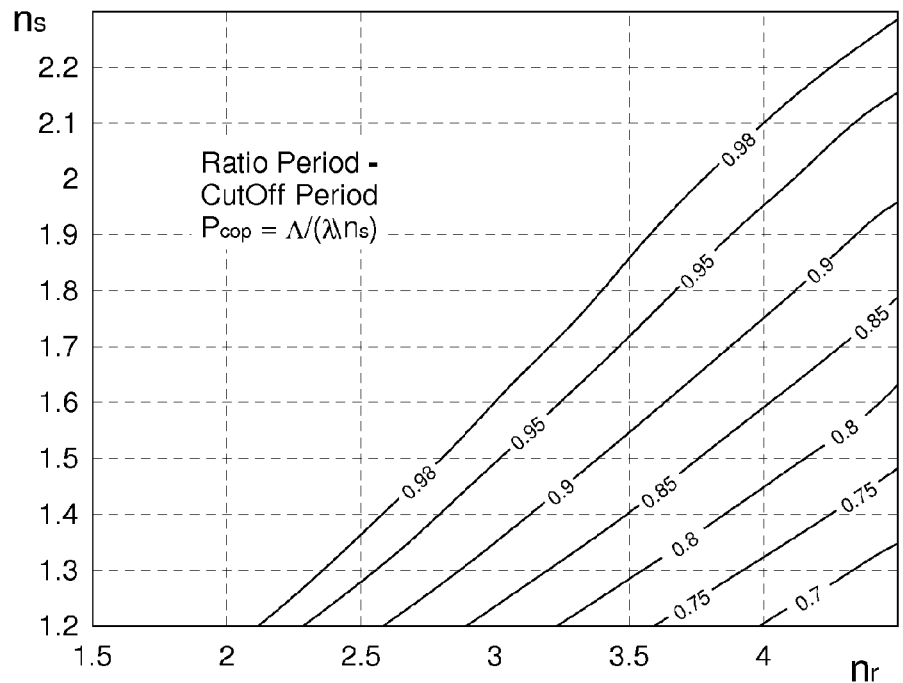
FIG. 13 shows the period normalized to the diffraction order cutoff period $P_{cop}=\Lambda/(\lambda/n_s)$ of the optimized polarization transforming gratings versus the refractive indexes of ridge $n_r$ and substrate $n_s$ in the selected area of FIG. 9.

Beyond tuning the three geometrical parameters Λ, W$_r$ and H of the specific example given above, the same code was used to give all possible devices according to the invention under the hypotheses of air- or vacuum-filled cover and grooves, under normal incidence by proceeding to the numerical fine tuning step by step in the normalized Λ/λ, D and H/λ space, each optimized triplet being the departure point for the fine tuning of the neighboring triplet. This gives rise to the exhaustive determination of all possible triplets belonging to the device of the invention with n$_c$=n$_g$=1 versus both substrate and ridge index within ranges that can be covered with existing transparent materials at the desired optical wavelengths and that fulfill n$_s$>n$_c$ and n$_r$>n$_s$. Each parameter of the solution triplets is given in FIG. 10-12, where the labeled curves are the level curves on the surfaces Λ(n$_s$,n$_r$)/λ, D(n$_s$,n$_r$) and H(n$_s$,n$_r$)/λ. As a measure of the quality of the polarization transformer, FIG. 9 depicts the transmission through the mentioned setup with crossed polarizers which was used for the numerical optimization. FIG. 13 shows the ratio P$_{cop}$, between the period of the grating and the critical period according to Equation (1), showing that this ratio approaches P$_{cop}$=1 for combinations with small ridge index and large substrate index (i.e. the upper left corner in this diagram). FIG. 13 illustrates, that there is a forbidden zone in the direction of large substrate indexes and small ridge indexes (left upper corner in FIG. 13) where the gratings designed by the described algorithm turn out to have too large a period and do not fulfill the subwavelength condition, i.e. they would give rise to propagating diffraction orders in the substrate. The area of the (n$_s$,n$_r$) plane containing the devices of the invention not violating this subwavelength condition is indicated by curve 20 in FIG. 9. This area is in the case of the numerical analysis of FIG. 9 (restricted to 1.5<n$_r$<4.5 and 1.2<n$_s$<2.3) approximately defined by:

$$1.5 < n_r < 4.5$$

$$n_s < 2.3$$

$$n_s < 0.381 n_r^4 - 3.638 n_r^3 + 13.102 n_r^2 - 20.653 n_r + 13.206 \quad (16)$$

Figure 10:
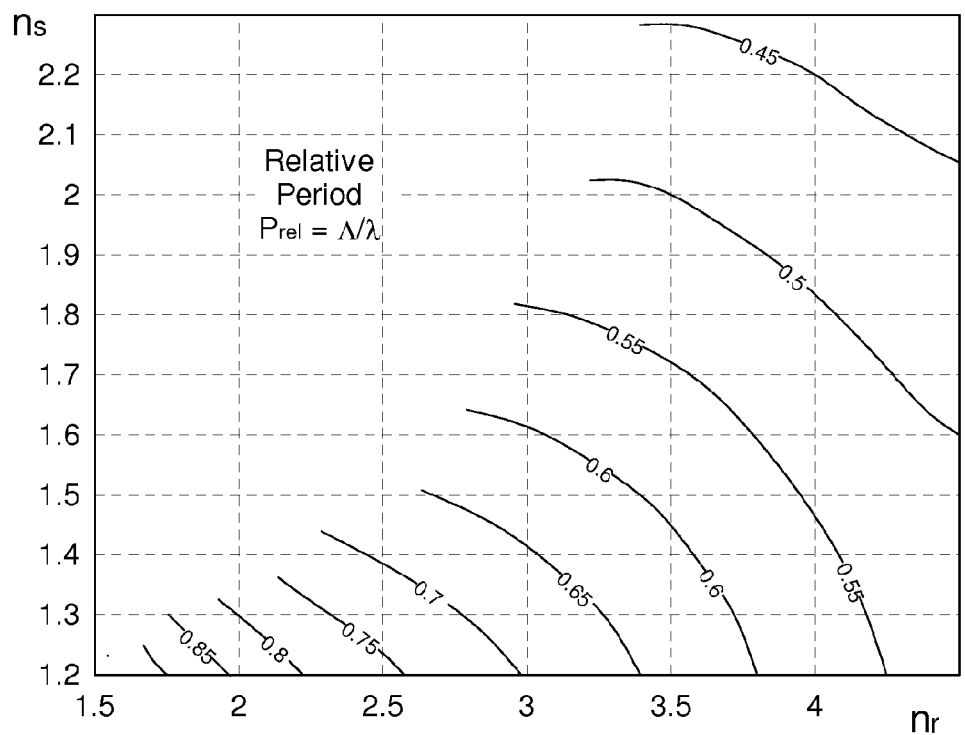
FIG. 10 shows the relative period $P_{rel}=\Lambda/\lambda$ of the optimized polarization transforming gratings versus the refractive indexes of ridge $n_r$ and substrate $n_s$ in the selected area of FIG. 9.
Figure 11:
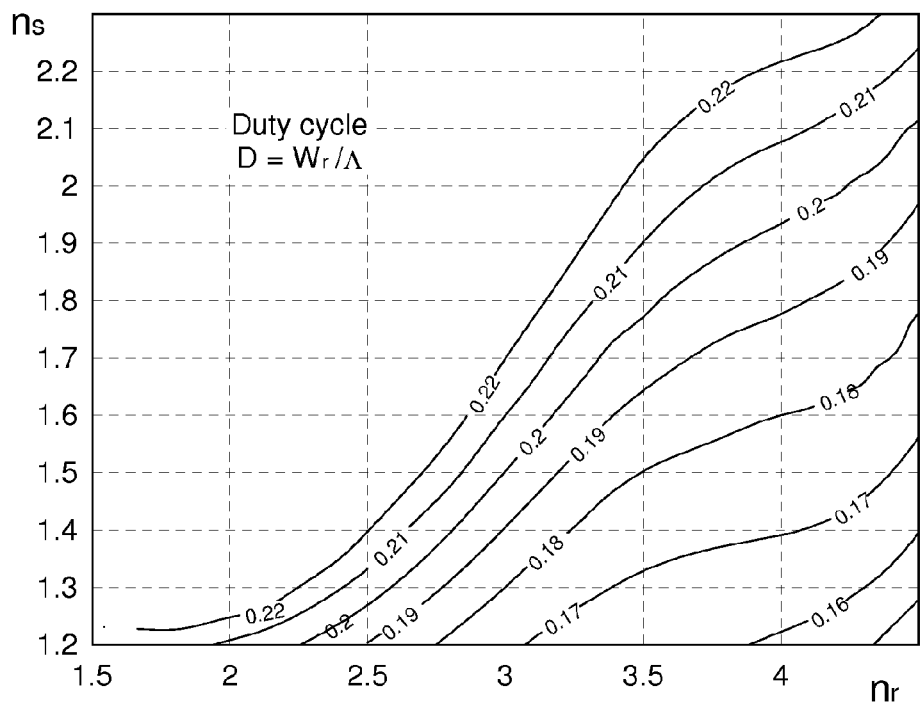
FIG. 11 shows the duty cycle $D=W_r/\Lambda$ of the optimized polarization transforming gratings versus the refractive indexes of ridge $n_r$ and substrate $n_s$ in the selected area of FIG. 9.

For very large ridge indexes (n$_r$>4) and/or if a slightly lower efficiency of the polarization transformer is acceptable (between 80% and 90%), the condition on the substrate index is less stringent. A usable polarization transformer can in this case be designed up to n$_s$=2.7. In a preferred variant achieving high efficiencies, the last condition is replaced by a easier relationship corresponding to the linear curve 22 in FIG. 9, i.e. n$_r$>2n$_s$. In this limited region, the efficiency is above 90% and FIG. 9 shows that it is possible to have more than 98% in a particular validity area. It can be demonstrated that, in the state of the art, the maximum efficiency remains under 93% for n$_s$=n$_r$ between 2.6 and 4.0. The present invention gives exceptional results. Not only the grating period is larger and the groove aspect ratio is smaller than in the state of the art, but also the efficiency of the polarization transformers according to the invention is much higher than the maximum efficiency of corresponding polarization transformers of the state of the art. Within this area, the diagrams of FIG. 10-12 provides practical limits of the geometrical parameters of the devices of the invention in the case of air/vacuum cover and grooves as well as the range in which they are defined. The relative period P$_{rel}$=Λ/λ of the grating (FIG. 10) has substantially a value between 0.4 and 0.9 (0.4<P$_{rel}$<0.9). The lower limit of P$_{rel}$ is chosen slightly smaller than the smallest value of 0.45 appearing within the scanning range of FIG. 10, since values of P$_{rel}$<0.45 may be needed in the case of larger substrate indices (n$_s$>2.3 at the upper right corner of FIG. 10). According to the invention, the case of P$_{rel}$=0.4 is considered as an approximate lower limit for the relative period. In the case of P$_{rel}$<0.4 the fabricability of the polarization transformer would no longer be superior to that of the state of the art solution because of the required very high ridge aspect ratio combined with a small period. With n$_c$ greater than 1.0, this condition according to the invention is P$_{rel}$>0.4/n$_c$.

The practical limits of the substrate refractive index of the polarization transformer of the invention are 1.2<n$_s$<2.7. The upper limit is determined from the fact that the required refractive index for the ridge material would in the case of n$_s$>2.7 be larger than approximately 5.4 in order to have a high efficiency, above 90% (as can be seen by considering in particular line 22 in FIG. 9, which indicates the minimum required ridge refractive index as a function of the substrate refractive index for an efficiency above 90%). This is approximately the limit for optical materials in the considered wavelength range. Furthermore, n$_s$>2.7 would also require a polarization transformer with P$_{rel}$ in the range or below 0.4, which is considered as the practical lower limit according to the present invention.

The duty cycle D=W$_r$/Λ of the grating (FIG. 11) has substantially a value between 0.15 and 0.25 (0.15<D<0.25). The relative height H$_{rel}$=H/λ of the grating (FIG. 12) has substantially a value between 0.16 and 1.0 (0.16<H$_{rel}$<1.0) and preferably between 0.2 and 0.5 (0.2<H$_{rel}$<0.5). With n$_c$ greater than 1.0, those conditions according to the invention are 0.15/n$_c$<D<0.25/n$_c$ and 0.2/n$_c$<H$_{rel}$<0.5/n$_c$.

Figure 14:
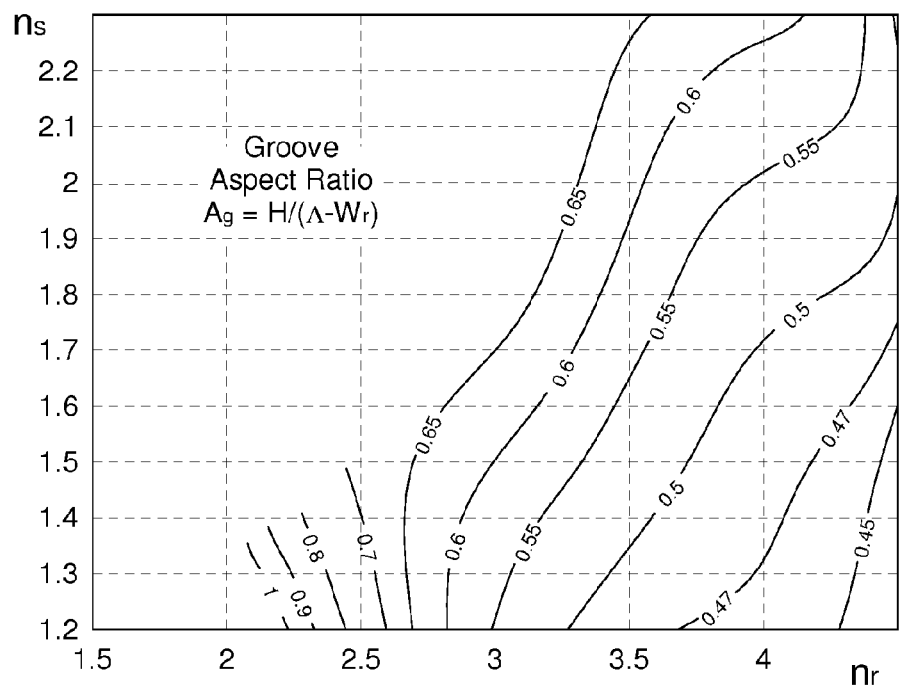
FIG. 14 shows the groove aspect ratio $A_g=H/(\Lambda-W_r)$ of the optimized polarization transforming gratings versus the refractive indexes of ridge $n_r$ and substrate $n_s$ in the selected area of FIG. 9.

Furthermore, FIG. 14 shows the groove aspect ratio of all solution triplets, which stays below 1.0 for the major part of the area of the device of the invention, confirming the strongly relaxed requirements on the fabrication compared to the state of the art.

From the set of exact results a two-dimensional polynomial expression was derived for each optimized geometrical parameter versus n$_s$ and n$_r$, enabling the straightforward determination of each geometrical parameter for any couple of n$_s$ and n$_r$ index value. These polynomials are of the following form:

$$f(n_r, n_s) \approx c_{00} + c_{10}n_r + c_{01}n_s + c_{20}n_r^2 + c_{11}n_r n_s + c_{12}n_s^2 + c_{30}n_r^3 + c_{21}n_r^2 n_s + c_{12}n_r n_s^2 + c_{03}n_s^3 + \ldots \quad (17)$$

On the basis of expression (17) the values of the generalized grating parameters and the achievable transmission through crossed polarizers are given in Table 1 hereafter. This approximate analytical expression provides the solution for the disclosed linear polarization rotating grating for any pair of refractive index (n$_s$,n$_r$) satisfying the required inequality relationships between indexes.

TABLE 1

Coefficients of the polynomial approximation (see Expression (17)) of the normalized grating parameters from FIG. 9 to 12.

| coefficient | Merit value (Transmission for crossed Polarizers) | relative period $P_{rel} = \Lambda/\lambda$ | duty cycle $D = W_r/\Lambda$ | relative height $H_{rel} = H/\lambda$ |
|---|---|---|---|---|
| $C_{00}$ | 224.59 | 3.2264 | −1.6212 | 71.6608 |
| $C_{01}$ | −41.35 | −2.4227 | 1.8312 | −67.5264 |
| $C_{10}$ | −145.63 | 0.3277 | 0.6719 | −69.4952 |
| $C_{21}$ | −5.23 | 0.8485 | −0.6745 | 25.0883 |
| $C_{22}$ | 92.19 | 0.556 | −0.8187 | 55.4527 |
| $C_{02}$ | −35.2 | −1.3733 | 0.5295 | 22.5732 |
| $C_{30}$ | 1.75 | −0.1614 | 0.1093 | −4.7556 |
| $C_{21}$ | −12.3 | −0.0549 | 0.2351 | −15.3462 |
| $C_{12}$ | 4.82 | −0.0441 | −0.1221 | −15.6794 |
| $C_{03}$ | 2.23 | 0.5398 | −0.1122 | −2.2388 |
| $C_{40}$ | 0 | 0.0125 | −0.0089 | 0.4696 |
| $C_{31}$ | 0 | −0.0026 | 0.0002 | 1.8858 |
| $C_{22}$ | 0 | 0.0144 | −0.0635 | 2.7572 |
| $C_{13}$ | 0 | −0.0177 | 0.1203 | 2.2824 |
| $C_{04}$ | 0 | −0.0624 | −0.0508 | −0.5852 |
| $C_{50}$ | 0 | 0 | 0 | −0.0203 |
| $C_{41}$ | 0 | 0 | 0 | −0.0817 |
| $C_{32}$ | 0 | 0 | 0 | −0.1832 |
| $C_{23}$ | 0 | 0 | 0 | −0.1503 |
| $C_{14}$ | 0 | 0 | 0 | −0.1731 |
| $C_{05}$ | 0 | 0 | 0 | 0.1439 |

All numerical examples up to this point assumed a cover and groove index of $n_c=1.0$, i.e. vacuum or air. However, the polynomial approximation using expression (17) and Table 1 can also be used in the case of a cover and groove index different from $n_c=1.0$, as will be explained hereafter.

Two binary corrugation gratings (subscript 1 and 2 in the following relationships) are identical regarding their optical diffraction spectra if their parameters are converted via an arbitrary real factor $\alpha$ according to the relationships:

$$n_{r,2}=n_{r,1}\alpha, n_{s,2}=n_{s,1}\alpha, n_{c,2}=n_{c,1}\alpha \quad (18)$$

$$\Lambda_2=\Lambda_1/\alpha, W_{r,2}=W_{r,1}/\alpha, H_2=H_1/\alpha \quad (19)$$

To calculate a device according to the invention having a cover and groove index $n_{c,2}>1.0$, and substrate and ridge indexes $n_{s,2}$ and $n_{r,2}$, a grating with a cover and groove index of $n_{c,1}=1.0$ (as described so far in the invention) and scaled substrate and ridge indexes $n_{s,1}=n_{s,2}/\alpha$ and $n_{r,1}=n_{r,2}/\alpha$ where $\alpha=n_{c,2}$ is first designed, according to the described method or by using FIG. 10-12 or expressions (17). Then the resulting geometrical parameters $\Lambda_1$, $W_{r,1}$, $H_1$ of the device with cover and groove index of $n_{c,1}=1.0$ are transformed via Equation (19) to give the geometrical parameters $\Lambda_2$, $W_{r,2}$, $H_2$ of the grating with the desired cover and groove index $n_{c,2}>1$.

This generalizing procedure will be illustrated on the basis of the first example (amorphous silicon ridges on fused silica substrate at 1030 nm wavelength) where the aim now is to find out the device of the invention at the same wavelength in the presence of a cover and groove medium of refractive index 1.1 (e.g. a porous sol-gel). The grating whose geometrical parameters must be found out (subscript 2) is characterized by the set of refractive indexes: $n_{c,2}=1.1$, $n_{s,2}=1.44$, $n_{r,2}=3.7$. The factor $\alpha$ to be used in Eq. (18) is thus 1.1. The refractive indexes of the corresponding grating with a cover index of 1.0 (subscript 1) are calculated by using Equation (18), and the polynomial expressions given by Equation (17) and Table 1 are used to determine its geometrical parameters. It is given by:

$$n_{c,1}=n_{c,2}/\alpha=1.0, n_{r,1}=n_{r,2}/\alpha=3.36, n_{s,1}=n_{s,2}/\alpha=1.31$$

$$\Lambda_1=658 \text{ nm}, W_{r,1}=112 \text{ nm}, H_1=277 \text{ nm}$$

Relationships (19) are now used to retrieve the geometrical parameters of the grating device of the invention with cover and groove index of 1.1. These are:

$$n_{c,2}=1.1, n_{r,2}=3.7, n_{s,2}=1.44,$$

$$\Lambda_2=598 \text{ nm}, W_{r,2}=102 \text{ nm}, H_2=252 \text{ nm}$$

This polarization transformer transmits 97.6% of the TE and 99.0% of the TM polarizations while giving a phaseshift between them of $1.03\pi$.

The invention claimed is:

1. A planar polarization transformer for a normally incident optical wave or beam having a given vacuum wavelength $\lambda$, comprising:
    an optical planar grating between a cover medium of refractive index $n_c$ and an optical substrate of refractive index $n_s$ larger than the cover refractive index $n_c$, this planar grating defining a binary index modulation or corrugation of substantially rectangular profile with periodic ridges, having a ridge refractive index $n_r$ and a ridge width $W_r$, and interleaved grooves having a groove width $W_g$ and groove refractive index $n_g$ equal to the cover refractive index $n_c$ ($n_g=n_c$), this planar grating locally having a grating period $\Lambda$ which is smaller than the wavelength of the incident optical wave divided by the substrate refractive index ($\Lambda<\lambda/n_s$),
    wherein said ridge refractive index $n_r$ is larger than the substrate refractive index $n_s$, wherein said grating period $\Lambda$ is larger than $0.4\cdot\lambda/n_c$, wherein said substrate refractive index $n_s$ is smaller than $2.7\cdot n_c$, and wherein the index modulation or corrugation is designed such that, according to a grating mode dispersion equation, an effective index of a TE fundamental grating mode $TE_0$ is larger than the substrate index $n_s$ and the effective index of a TM fundamental grating mode $TM_0$ is larger than the cover refractive index $n_c$ and smaller than the substrate index $n_s$.

2. The polarization transformer according to claim 1, wherein said substrate refractive index $n_s$ is smaller than $2.3\cdot n_c$.

3. The polarization transformer according to claim 1, wherein the optical substrate is a thick layer of thickness $t_{os}$ on a higher index transparent mechanical support, the thickness $t_{os}$ being larger than $-\ln(0.1)\cdot\lambda/(2\pi(\lambda/\Lambda)^2-n_s^2)^{1/2})$.

4. The polarization transformer according to claim 1, wherein the cover and the grooves are filled with air or vacuum.

5. The polarization transformer according to claim 4, wherein said substrate is composed of high thermal conductivity $MgF_2$ or sapphire or YAG.

6. The polarization transformer according to claim 1, wherein the cover and the grooves are filled with a transparent polymer.

7. The polarization transformer according to claim 1, wherein the cover and the grooves are filled with a transparent liquid.

8. The polarization transformer according to claim 1, wherein said grating has a groove aspect ratio, defined by the height H of said grooves divided by the width $W_g$ of these grooves, which is smaller than 1.5.

9. The polarization transformer according to claim 1, wherein the substrate refractive index $n_s$ has a value between $1.0\cdot n_c$ and $2.3\cdot n_c$ ($1.0\cdot n_c<n_s<2.3\cdot n_c$) and the ridge refractive index $n_r$ has a value between $1.5\cdot n_c$ and $4.5\cdot n_c$ ($1.5\cdot n_c<n_r<4.5\cdot n_c$), and wherein for a given ridge refractive index $n_r$ the substrate refractive index $n_s$ is lower than the following function F of the ridge index $n_r$: $F(n_r)=(0.381 \cdot (n_r/n_c)^4 - 3.638 \cdot (n_r/n_c)^3 + 13.102 \cdot (n_r/n_c)^2) \cdot n_c - 20.653 \cdot n_r + 13.206 \cdot n_c$ ($n_s < F(n_r)$).

10. The polarization transformer according to claim 1, wherein the substrate refractive index $n_s$ has a value between $1.0 \cdot n_c$ and $2.3 \cdot n_c$ ($1.0 \cdot n_c < n_s < 2.3 \cdot n_c$) and the ridge refractive index $n_r$ has a value between $1.5 \cdot n_c$ and $4.5 \cdot n_c$ ($1.5 \cdot n_c < n_r < 4.5 \cdot n_c$), and wherein the value of the ridge refractive index is at least twice the one of the substrate refractive index ($n_r > 2n_s$).

11. The polarization transformer according to claim 9, wherein the relative period $P_{rel} = \Lambda/\lambda$ has substantially a value between $0.4/n_c$ and $0.9/n_c$ ($0.4/n_c < P_{rel} < 0.9/n_c$).

12. The polarization transformer according to claim 9, wherein, in the case $n_c=1.0$, the relative period $P_{rel}=\Lambda/\lambda$, has substantially a value, in function of a given pair $n_r$ and $n_s$, which is determined by a polynomial expression given in expression (17) of the description with the coefficients given in Table 1 in column $P_{rel}$.

13. The polarization transformer according to claim 9, wherein the relative height $H_{rel}=H/\lambda$ of the grating has substantially a value between $0.16/n_c$ and $1.0/n_c$ ($0.16/n_c < H_{rel} < 1.0/n_c$).

14. The polarization transformer according to claim 9, wherein, in the case $n_c=1.0$, the relative height $H_{rel}=H/\lambda$ of the grating has substantially a value, in function of a given pair $n_r$ and $n_s$, which is determined by a polynomial expression given in expression (17) of the description with the coefficients given in Table 1 in column $H_{rel}$.

15. The polarization transformer according to claim 13, wherein the duty cycle $D=W_r/\lambda$ has substantially a value between $0.15/n_c$ and $0.25/n_c$ ($0.15/n_c < D < 0.25/n_c$).

16. The polarization transformer according to claim 9, wherein, in the case $n_c=1.0$, the duty cycle $D=W_r/\Lambda$ has substantially a value, in function of a given pair $n_r$ and $n_s$, which is determined by a polynomial expression given in expression (17) of the description with the coefficients given in Table 1 in column D.

17. A design method for a planar polarization transformer comprising an optical planar grating between a cover medium of refractive index $n_c$ and an optical substrate of refractive index $n_s$ larger than the cover refractive index $n_c$, this planar grating defining a binary index modulation or corrugation of substantially rectangular profile with periodic ridges, having a ridge refractive index $n_r$ and a ridge width $W_r$, and interleaved grooves having a groove width $W_g$ and groove refractive index $n_g$ equal to the cover refractive index $n_c$, this planar grating locally having a grating period $\Lambda$ which is smaller than a wavelength $\lambda$ of an incident optical wave or beam divided by the substrate refractive index, said ridge refractive index $n_r$ being larger than the substrate refractive index $n_s$, this design method comprising:
  choosing the wavelength $\lambda$;
  choosing the period $\Lambda$ in the range $0.4 \cdot \lambda/n_c < \Lambda < \lambda/n_s$;
  determining a duty cycle $D=W_r/\Lambda$ from a $TM_0$ dispersion equation of a modal theory to substantially realize $n_{eff}^{TM0}=(n_c \cdot n_s)^{1/2}$, $n_{eff}^{TM0}$ being an effective index of a fundamental TM mode ($TM_0$) of the planar grating;
  determining $n_{eff}^{TE0}$ from a TE dispersion equation of the modal theory for the chosen period and wavelength and the determined duty cycle D, $n_{eff}^{TE0}$ being the effective index of a fundamental TE mode ($TE_0$) of the planar grating;
  calculating of the reflection and transmission phases $\phi_r^{TE}$ and $\phi_t^{TE}$ of the $TE_0$ mode by the modal theory;
  calculating a first height $H^{FP}$ from the expression $$H^{FP} = \frac{\lambda}{2\pi n_{eff}^{TE}}(\pi - 1/2\varphi_r^{TE})$$

calculating a second height $H^{dif}$ from the expression $$H^{dif} = \frac{\lambda}{2\pi(n_{eff}^{TE} - n_{eff}^{TM})}(\pi - \varphi_t^{TE})$$

calculating a height average $H=(H^{FP}+H_{dif})/2$ defining a grating height; and
  forming the grating on the optical substrate with the calculated grating height.

18. The design method according to claim 17, wherein it further comprises an optimization step in which a fine tuning of geometrical parameters ($\Lambda$, D and H) of the planar grating with an appropriate numerical optimization tool by taking as departure point the corresponding geometrical parameters obtained in the design method of claim 17.

19. The design method according to claim 18, wherein said numerical optimization tool defines a gradient search method using a merit function corresponding to the transmission of the incident optical wave or beam through two crossed polarizers with the grating arranged between them and oriented at 45° relative to each polarizer direction.

20. A design method for a planar polarization transformer, wherein the cover refractive index $n_c$ is greater than 1.0, wherein the design method according to claim 17 is used with $n_c^*$ being equal to 1.0, a scaled substrate refractive index $n_s^*=n_s/n_c$, $n_s$ being the substrate refractive index of the planar polarization transformer, and a scaled ridge refractive index $n_r^*=n_r/n_c$, $n_r$ being the ridge refractive index of the grating forming the planar polarization transformer, and wherein the period $\Lambda^*$ the ridge width $W_r^*$ and the groove height $H^*$ resulting from the design method are divided by the value of $n_c$ in order to obtain the grating period $\Lambda$, the ridge width $W_r$ of the grating and the groove height H of the grating.

* * * * *